(12) United States Patent
Kim et al.

(10) Patent No.: US 12,021,174 B2
(45) Date of Patent: Jun. 25, 2024

(54) DISPLAY DEVICE

(71) Applicant: Samsung Display Co., Ltd., Yongin-si (KR)

(72) Inventors: Jin Sun Kim, Yongin-si (KR); Soo Hyun Moon, Yongin-si (KR); Yong Sub Shim, Yongin-si (KR); Hae Ju Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 295 days.

(21) Appl. No.: 17/352,910

(22) Filed: Jun. 21, 2021

(65) Prior Publication Data

US 2022/0140196 A1    May 5, 2022

(30) Foreign Application Priority Data

Nov. 4, 2020   (KR) .......................... 10-2020-0146254

(51) Int. Cl.
*H01L 33/38*    (2010.01)
*H01L 33/62*    (2010.01)

(52) U.S. Cl.
CPC ............ *H01L 33/387* (2013.01); *H01L 33/62* (2013.01)

(58) Field of Classification Search
CPC ... H01L 25/0753; H01L 25/167; H01L 33/62; H01L 33/387
See application file for complete search history.

(56) References Cited

U.S. PATENT DOCUMENTS

| | | | |
|---|---|---|---|
| 9,329,433 B2 | 5/2016 | Negishi | |
| 2019/0115513 A1* | 4/2019 | Im | ........................... H01L 33/06 |
| 2021/0111323 A1* | 4/2021 | Kim | ....................... G09G 3/325 |
| 2021/0134768 A1 | 5/2021 | Lee et al. | |
| 2021/0134877 A1 | 5/2021 | Kim et al. | |
| 2022/0005979 A1 | 1/2022 | Kang | |

FOREIGN PATENT DOCUMENTS

| | | |
|---|---|---|
| KR | 10-2012-0138805 A | 12/2012 |
| KR | 10-2020-0062458 A | 6/2020 |
| KR | 10-2020-0085977 A | 7/2020 |
| KR | 10-2020-0088954 A | 7/2020 |

(Continued)

OTHER PUBLICATIONS

PCT International Search Report issued in corresponding PCT Application No. KR/PCT2021/011557, dated Dec. 6, 2021, 3 pages.

*Primary Examiner* — Latanya N Crawford Eason
(74) *Attorney, Agent, or Firm* — Lewis Roca Rothgerber Christie LLP

(57) ABSTRACT

A display device includes: a first electrode and a second electrode spaced apart from each other; first and second light emitting elements between the first electrode and the second electrode; a first contact electrode contacting the first electrode and a first end portion of the first light emitting element; a second contact electrode contacting a second end portion of the first light emitting element; a third contact electrode contacting the second contact electrode and a first end portion of the second light emitting element and overlapping the first electrode; and a fourth contact electrode contacting a second end portion of the second light emitting element and overlapping the second electrode. The first contact electrode and the third contact electrode are on the same layer.

20 Claims, 14 Drawing Sheets

(56) References Cited

FOREIGN PATENT DOCUMENTS

| KR | 10-2020-0098767 A | 8/2020 |
| KR | 10-2021-0031588 A | 3/2021 |
| KR | 10-2021-0044938 A | 4/2021 |
| KR | 10-2021-0053391 A | 5/2021 |
| KR | 10-2021-0054117 A | 5/2021 |

* cited by examiner

DISPLAY DEVICE

CROSS-REFERENCE TO RELATED APPLICATION

This application claims priority to and the benefit of Korean Patent Application No. 10-2020-0146254, filed in the Korean Intellectual Property Office on Nov. 4, 2020, the entire content of which is incorporated herein by reference.

BACKGROUND

1. Field

Aspects of embodiments of the present disclosure relate to a display device.

2. Description of the Related Art

Recently, as interest in an information displays increases, research and development into display devices are continuously being conducted.

SUMMARY

Embodiments of the present disclosure provide a display device that may exhibit improved light emission efficiency.

Aspects and features of the present disclosure are not limited to that mentioned above, and other aspects and features that are not mentioned may be understood by a person of an ordinary skill in the art based on the following description.

An embodiment of the present disclosure provides a display device including: a first electrode and a second electrode spaced apart from each other; first and second light emitting elements between the first electrode and the second electrode; a first contact electrode contacting the first electrode and a first end portion of the first light emitting element; a second contact electrode contacting a second end portion of the first light emitting element; a third contact electrode contacting the second contact electrode and a first end portion of the second light emitting element and overlapping the first electrode; and a fourth contact electrode contacting a second end portion of the second light emitting element and overlapping the second electrode. The first contact electrode and the third contact electrode are disposed on the same layer.

The display device may further include an insulation layer on the second contact electrode and the fourth contact electrode.

The insulation layer may not overlap the first end portion of the first and second light emitting elements.

Each of the first and second light emitting elements may include a p-type semiconductor layer at the first end portion.

The third contact electrode may contact the second contact electrode through a contact opening penetrating through the insulation layer.

The second contact electrode and the fourth contact electrode may be on the same layer.

The first electrode may have a first area, a second area, and a third area between the first area and the second area, and the second electrode may extend around a periphery of the second area of the first electrode.

The first area and the second area of the first electrode may extend in a first direction, and the third area of the first electrode may extend in a second direction crossing the first direction.

The first and second light emitting elements may be between the first area of the first electrode and the second electrode.

The first area may have a first branch area extending from one end of the third area in the first direction, and a second branch area extending from the one end of the third area in an opposite direction of the first direction.

One end of the second electrode may face the first branch area of the first electrode, and the other end of the second electrode may face the second branch area of the first electrode.

The first light emitting element may be between the first branch area of the first electrode and the second electrode, and the second light emitting element may be between the second branch area of the first electrode and the second electrode.

The display device may further include third and fourth light emitting elements between the second area of the first electrode and the second electrode.

The second area may include a third branch area extending from the other end of the third area in the opposite direction to the first direction, and a fourth branch area extending from the other end of the third area in the first direction.

The third light emitting element may be between the third branch area of the first electrode and the second electrode, and the fourth light emitting element may be between the fourth branch area of the first electrode and the second electrode.

The display device may further include an insulation layer on the second end portions of the first to fourth light emitting elements, and the insulation layer may not overlap the first end portions of the first to fourth light emitting elements.

Each of the first to fourth light emitting elements may include a p-type semiconductor layer at the first end portion.

The display device may further include a fifth contact electrode contacting the fourth contact electrode and the first end portion of the third light emitting element.

The fifth contact electrode may contact the fourth contact electrode through a contact opening penetrating through the insulation layer.

The fifth contact electrode may be on the same layer as the first contact electrode and the third contact electrode.

Other embodiments are described in the detailed description and drawings.

According to an embodiment of the present disclosure, light emitting elements are connected in series by using contact electrodes and a third insulation layer disposed between the contact electrodes does not overlap a first end portion (e.g., a first semiconductor layer) of the light emitting elements, which emits a relatively large amount of light. Thus, a display panel exhibiting improved light emission efficiency is provided.

Aspects and features of embodiments of the present disclosure are not limited by what is described above, and additional various aspects and features are included in the following detailed description and in the claims.

DETAILED DESCRIPTION

Figure 1:
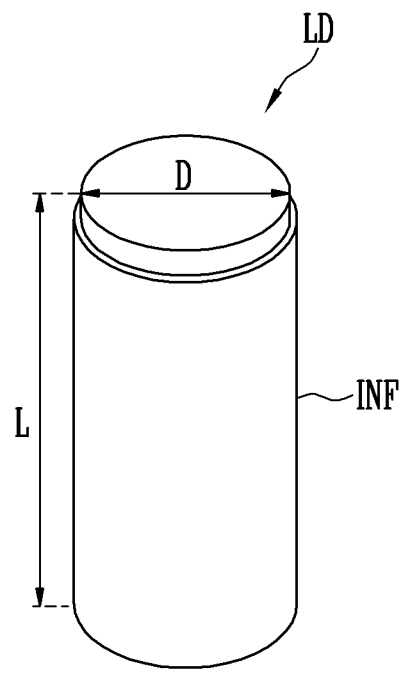
FIGS. 1 and 2 illustrate a perspective view and a cross-sectional view, respectively, of a light emitting element according to an embodiment.

Aspects and features of the present disclosure, and methods of accomplishing the same, may be understood more readily by reference to the following detailed description and the accompanying drawings. The present disclosure may, however, be embodied in different forms and should not be construed as limited to the embodiments set forth herein. Example embodiments are described herein so that this disclosure will be thorough and complete and will fully convey the scope of the present disclosure to those skilled in the art. The present disclosure is defined the appended claims.

The terms used herein are for the purpose of describing particular embodiments only and is not intended to be limiting. As used herein, the singular forms "a" and "an" are intended to include the plural forms as well, unless the context clearly indicates otherwise. It will be further understood that the terms "comprise" and/or "comprising,", "include," or "including" and "have" or "having", when used in the present disclosure, specify the presence of stated elements, steps, operations, and/or devices but do not preclude the presence or addition of one or more other elements, steps, operations, and/or devices.

In addition, the term "connection" or "coupling," and variations thereof, such as "connected" or "coupled," may be understood to indicate a physical and/or electrical connection or coupling. Further, these terms may be understood to indicate a direct or indirect connection or coupling and an integrated or non-integrated connection or coupling.

It will be understood that when an element or a layer is referred to as being "on" another element or layer, it can be directly on another element or layer or intervening element(s) or layer(s) may also be present. Throughout the specification, the same reference numerals denote the same constituent elements.

Although the terms "first," "second," and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure.

Hereinafter, embodiments of the present disclosure will be described, in detail, with reference to the accompanying drawings.

Figure 2:
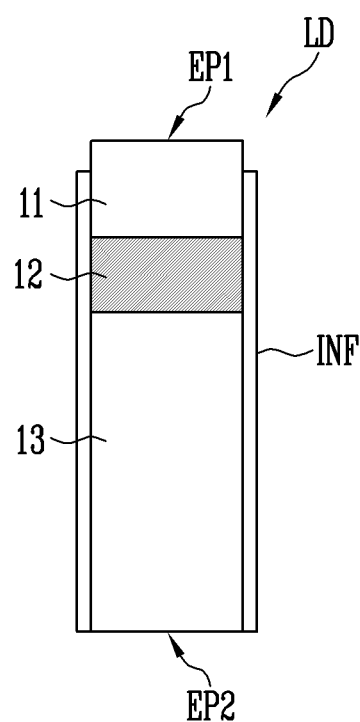

FIGS. 1 and 2 illustrate a perspective view and a cross-sectional view, respectively, of a light emitting element according to an embodiment. FIGS. 1 and 2 illustrate a cylindrically-shaped light emitting element LD, but the type and/or shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, when an extending (or extension) direction of the light emitting element LD is referred to as a length L direction, the light emitting element LD may include the first semiconductor layer 11, the active layer 12, and the second semiconductor layer 13 sequentially stacked along the length L direction.

The light emitting element LD may have a cylindrical shape extending along one direction (e.g., along the length L direction). The light emitting element LD may have a first end portion EP1 and a second end portion EP2. The first semiconductor layer 11 may be disposed on (or at) the first end portion EP1 of the light emitting element LD, and the second semiconductor layer 13 may be disposed on (or at) the second end EP2 of the light emitting element LD, but the present disclosure is not limited thereto.

In some embodiments, the light emitting element LD may be a light emitting element having a cylindrical shape and manufactured via an etching method or the like. In the present specification, the "cylindrical shape" includes a rod-like shape or bar-like shape (e.g., a shape having an aspect ratio greater than 1) that is long in the length L direction, such as a circular cylinder or a polygonal cylinder, but a shape of a cross-section thereof is not particularly limited. For example, the length L of the light emitting element LD may be larger than a diameter D thereof (or a width of a lateral cross-section thereof).

The light emitting element LD may have a size as small as a nanometer scale to a micrometer scale. For example, the light emitting element LD may each have the diameter D (or width) and/or the length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material from among InAlGaN, GaN, AlGaN, InGaN, AlN, and InN and may include a p-type semiconductor layer doped with a first conductive dopant, such as Mg. However, the material included in the first semiconductor layer 11 is not limited thereto, and the first semiconductor layer 11 may include (or may be made of) various suitable materials.

The active layer 12 is disposed on the first semiconductor layer 11 and may have a single-quantum or multi-quantum well structure. A position of the active layer 12 may be variously changed according to a type of the light emitting element LD. In some embodiments, a clad layer doped with a conductive dopant may be formed at an upper portion and/or a lower portion of the active layer 12. For example, the cladding layer may be formed of AlGaN or InAlGaN. In some embodiments, a material, such as AlGaN and InAlGaN, may be used to form the active layer 12, but other various suitable materials may form the active layer 12.

The second semiconductor layer 13 is disposed to on the active layer 12 and may include a semiconductor layer of a type different from that of the first semiconductor layer 11. For example, the second semiconductor layer 13 may include an n-type semiconductor layer. For example, the second semiconductor layer 13 may include a semiconductor material from among InAlGaN, GaN, AlGaN, InGaN, AlN, and InN and may include an n-type semiconductor layer doped with a second conductive dopant, such as Si, Ge, Sn, or the like. However, the material included in the second semiconductor layer 13 is not limited thereto, and the second semiconductor layer 13 may include (or may be formed of) various materials.

When a voltage of a threshold voltage or more is applied to respective ends of the light emitting element LD, the light emitting device LD emits light while electron-hole pairs are combined in the active layer 12. The light emission of the light emitting element LD may be controlled according to this principle, and the light emitting element LD may be used as a light source for various light emitting devices in addition to pixels of a display device. In an embodiment, an amount of light emitted from the first end portion EP1 of the light emitting element LD may be larger than that of light emitted from the second end EP2. For example, an amount of light emitted from the first semiconductor layer 11 may be larger than an amount of light emitted from the second semiconductor layer 13, but the present disclosure is not limited thereto.

The light emitting element LD may further include an insulation film INF provided on a surface thereof. The insulation film INF may be formed on the surface of the light emitting device LD so as to at least surround the active layer 12 (e.g., to surround a periphery of the active layer 12) and may further surround one area (e.g., one portion) of the first and second semiconductor layers 11 and 13.

The insulation film INF may expose respective end portions of the light emitting element LD having different polarities (e.g., the first and second ends EP1 and EP2). For example, the insulation film INF may expose one end of each of the first and second semiconductor layers 11 and 13 disposed at the first and second end portions EP1 and EP2 of the light emitting element LD. In another embodiment, the insulation film INF may expose side portions of the first and second semiconductor layers 11 and 13 adjacent to the first and second end portions EP1 and EP2 of the light emitting element LD having different polarities.

The insulation film INF may be a single layer or multi-layer structure including at least one insulation material from among a silicon oxide ($SiO_x$), a silicon nitride ($SiN_x$), a silicon oxynitride ($SiO_xN_y$), an aluminum oxide ($AlO_x$), and a titanium oxide ($TiO_x$). For example, the insulation film INF may be a double layer structure, and respective layers forming the double layer structure may include different materials. In such an embodiment, respective layers forming the double layer insulation film INF may be formed by different process methods. In an embodiment, the insulation film INF may be a double layer structure including (or made of) an aluminum oxide ($AlO_x$) and a silicon oxide ($SiO_x$), but the present disclosure is not limited thereto. In some embodiments, the insulation film INF may be omitted.

When the insulation film INF is provided to cover a surface of the light emitting element LD, particularly, an external circumferential surface of the active layer 12, the active layer 12 may be prevented from short-circuiting with a first pixel electrode or a second pixel electrode to be described in more detail below. Therefore, electrical stability of the light emitting element LD may be secured. In addition, an unwanted short circuit between the light emitting elements LD may not occur even when a plurality of light emitting elements LD are disposed in close proximity or close contact with each other. Further, the life-span and efficiency of the light emitting element LD may be improved by reducing or minimizing surface-defects of the light emitting element LD.

In an embodiment, the light emitting element LD may further include additional constituent element(s) in addition to the first semiconductor layer 11, the active layer 12, the second semiconductor layer 13, and/or the insulation film INF surrounding them. For example, the light emitting element LD may additionally include one or more of a phosphor layer, an active layer, a semiconductor layer, and/or an electrode layer disposed on one end side of the first semiconductor layer 11, the active layer 12, and/or the second semiconductor layer 13. For example, a contact electrode layer may be respectively disposed at the first and second end portions EP1 and EP2 of the light emitting element LD. FIGS. 1 and 2 illustrate a cylindrically-shaped light emitting element LD, but the type, structure, and/or shape of the light emitting element LD may be variously changed. For example, the light emitting element LD may have a core-shell structure having a polygonal horn shape.

A light emitting device including the light emitting element LD described above may be used in various types of devices that employ a light source in addition to a display device. For example, a plurality of light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that employ a light source, such as a lighting device.

Figure 3:
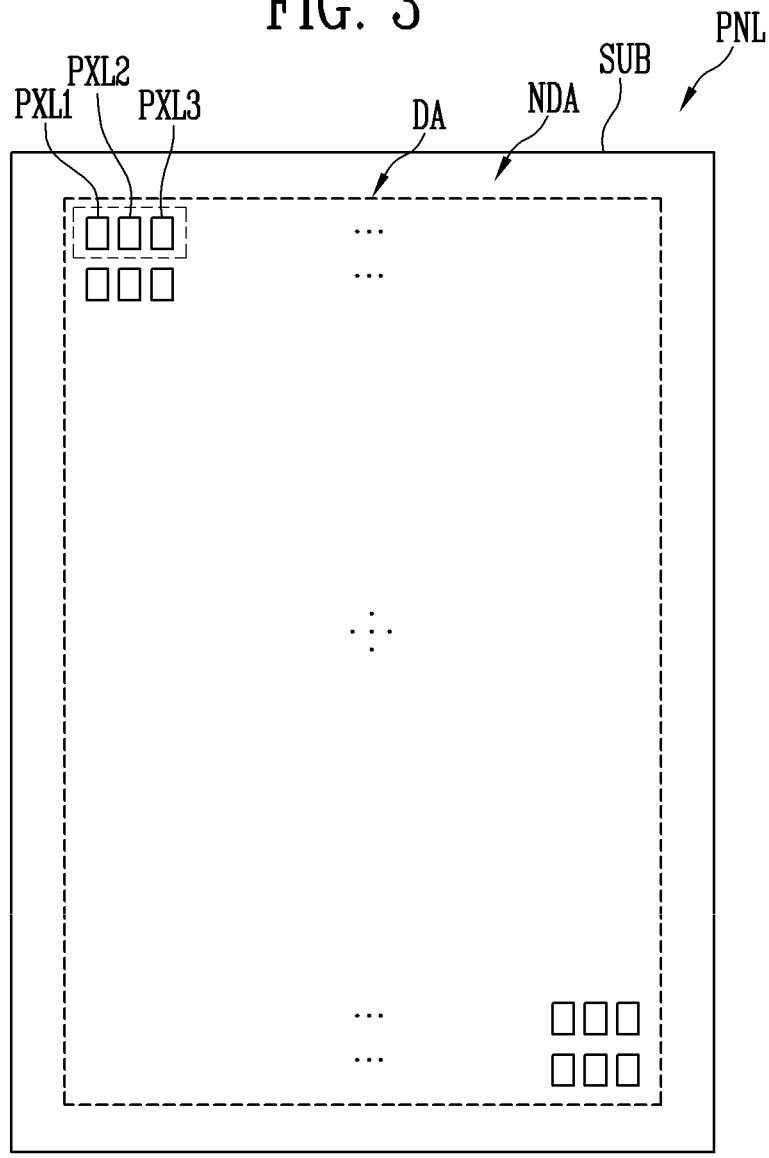
FIG. 3 illustrates a top plan view of a display device according to an embodiment.

FIG. 3 illustrates a top plan view of a display device according to an embodiment.

FIG. 3 illustrates a display panel PNL provided in the display device as an example of an electronic device that may use the light emitting element LD described above with respect to FIGS. 1 and 2 as a light source.

Each pixel unit PXU of the display panel PNL, and each pixel configuring the same, may include one or more light emitting elements LD. For better understanding and ease of description, FIG. 3 schematically illustrates the structure of the display panel PNL based on a display area DA. However, in some embodiments, a driving circuit portion (e.g., a scan driver and/or a data driver), wires, and/or pads may be further disposed in the display panel PNL.

Referring to FIG. 3, the display panel PNL may include a substrate SUB with the pixel unit PXU disposed on the substrate SUB. The pixel unit PXU may include first pixels PXL1, second pixels PXL2, and/or third pixels PXL3. Hereinafter, when arbitrarily referring to one or more pixels from among the first pixels PXL1, the second pixels PXL2, and the third pixels PXL3, or when comprehensively referring to two or more types of pixels, they will be referred to as a "pixel PXL" or "pixels PXL".

The substrate SUB is a base member of the display panel PNL and may be a rigid or flexible substrate or film. For example, the substrate SUB may be a rigid substrate made of glass or tempered glass or may be a flexible substrate made of a plastic or a metallic material (or a thin film), but the material and/or physical properties of the substrate SUB are not particularly limited.

The display panel PNL and the substrate SUB for forming the display panel include a display area DA for displaying an image and a non-display area NDA excluding (e.g., other than) the display area DA. The pixels PXL may be disposed in the display area DA. Various wires connected to the pixels PXL of the display area DA, pads, and/or internal circuit parts may be disposed in the non-display area NDA. The pixels PXL may be regularly arranged according to a stripe or PenTile® (a registered trademark of Samsung Display Co., Ltd.) (or diamond shape) arrangement structure. However, the arrangement structure of the pixels PXL is not limited thereto, and the pixels PXL may be arranged in the display area DA according to various structures and/or methods.

In some embodiments, two or more types of pixels PXL emitting light of different colors may be disposed in the display area DA. For example, in the display area DA, the first pixels PXL1 emitting light of the first color, the second pixels PXL2 emitting light of the second color, and the third pixels PXL3 emitting light of the third color may be arranged. At least one from among the first to third pixels PXL1, PXL2, and PXL3 disposed to be adjacent to each other may form one pixel unit PXU that may emit light of various colors. For example, each of the first to third pixels PXL1, PXL2, and PXL3 may be sub-pixel emitting light of a certain color. In some embodiments, the first pixel PXL1 may be a red pixel that emits red light, the second pixel PXL2 may be a green pixel that emits green light, and the third pixel PXL3 may be a blue pixel that emits blue light, but the present disclosure is not limited thereto.

In the embodiment, the first pixel PXL1, the second pixel PXL2, and the third pixel PXL3 are each provided with a first color light emitting element, a second color light emitting element, and a third color light emitting element as a light source, respectively, so that they respectively emit light of the first color, second color, and third color. In another embodiment, the first pixel PXL1, the second pixel PXL2, and the third pixel PXL3 are provided with light emitting elements of the same color and include color conversion layers and/or color filters of different colors disposed on respective light emitting elements so that they may emit light of the first color, the second color, and the third color, respectively. However, the color, type, and/or number of pixels PXL configuring each pixel unit PXU are not particularly limited. That is, the color of light emitted by each pixel PXL may be variously suitably changed.

The pixel PXL may include at least one light source driven by a control signal (e.g., a scan signal and a data signal) and/or a power source (e.g., a first power source and a second power source). In an embodiment, the light source may include at least one light emitting device LD according to, for example, the embodiment of FIGS. 1 and 2, for example, ultra-small cylindrical shape light emitting elements LD having a size as small as nanometer scale to micrometer scale. However, the present disclosure is not limited thereto, and various suitable types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 4:
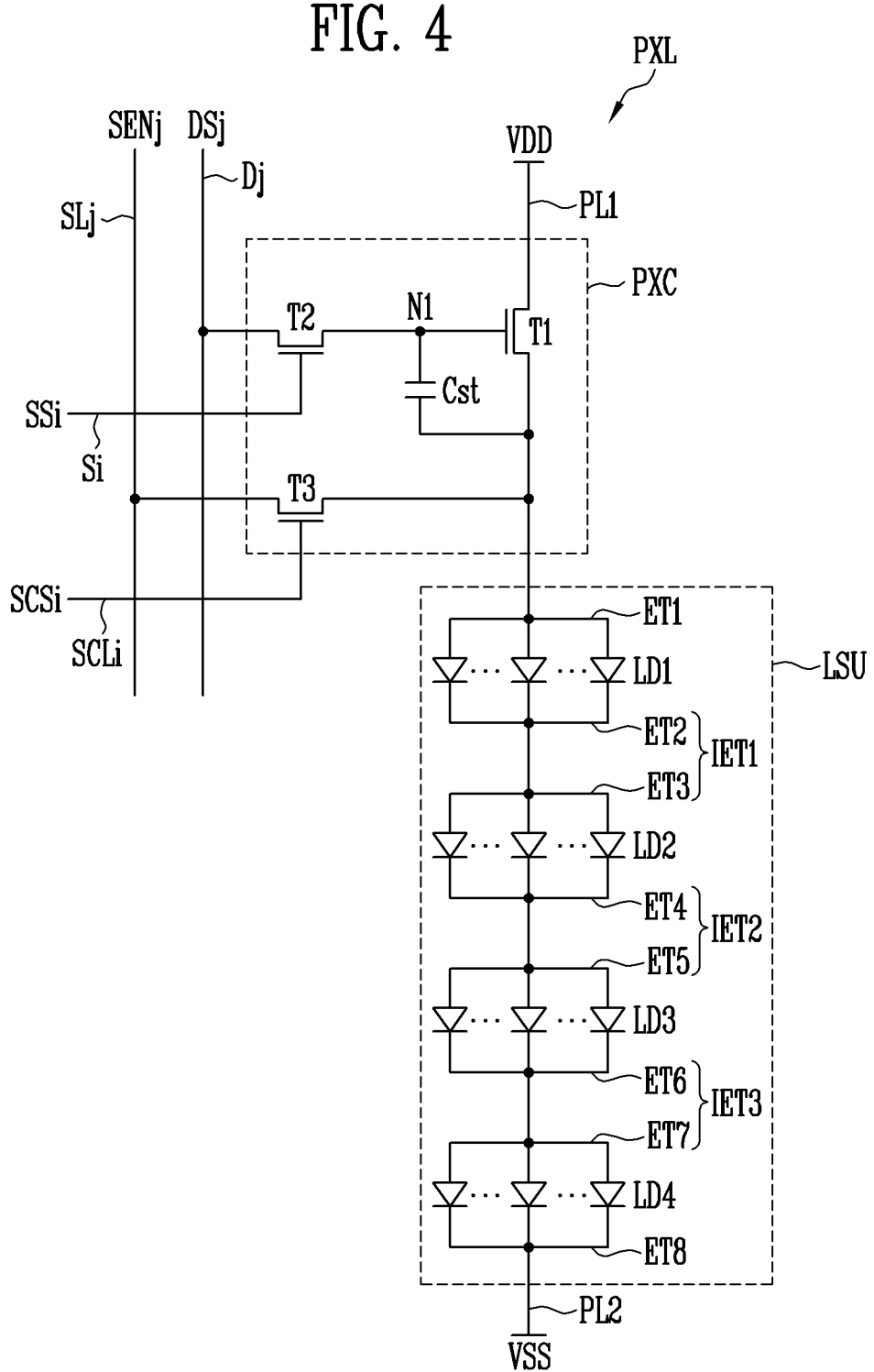
FIG. 4 illustrates a circuit diagram of a pixel according to an embodiment.

FIG. 4 illustrates a circuit diagram of a pixel according to an embodiment. For example, FIG. 4 illustrates an embodiment of the pixel PXL applicable to an active display device. However, the types of the pixel PXL and of the display device are not limited thereto.

In some embodiments, the pixel PXL shown in FIG. 4 may be one of the first pixel PXL1, the second pixel PXL2, and the third pixel PXL3 provided in the display panel PNL shown in FIG. 3. The first pixel PXL1, the second pixel PXL2, and the third pixel PXL3 may have substantially the same or similar structure.

Referring to FIG. 4, the pixel PXL may include a light source unit LSU for generating light at a luminance corresponding to a data signal and a pixel circuit PXC for driving the light source unit LSU.

The light source unit LSU may include at least one light emitting element LD electrically connected between a first power source VDD and a second power source VSS. The first end portion (e.g., the p-type end portion) of the light emitting elements LD may be electrically connected to the first power source VDD via the pixel circuit PXC and a first power line PL1, and the second end portion (e.g., the n-type end portion) of the light emitting elements LD may be electrically connected to the second power source VSS via a second power line PL2.

In some embodiments, the light emitting elements LD may be electrically connected to each other through various connection structures between the first power source VDD and the second power source VSS. For example, the light emitting elements LD may be connected to each other only in parallel or may be connected to each other only in series. In some embodiments, the light emitting elements LD may be connected in a serial/parallel mixed structure.

For example, the light emitting elements LD may be divided into four serial stages to be connected to each other in series/in parallel as shown in FIG. 4. In such an embodiment, each serial stage may include a pair of electrodes (e.g., two electrodes) and at least one light emitting element LD electrically connected between the pair of electrodes. Here, the number of the light emitting elements LD configuring respective serial stages may be the same or different from each other, but the number of the light emitting elements LD is not particularly limited.

For example, a first serial stage may include a first electrode ET1, a second electrode ET2, and at least one first light emitting element LD1 electrically connected between the first and second electrodes ET1 and ET2, and a second serial stage may include a third electrode ET3, a fourth electrode ET4, and at least one second light emitting element LD2 electrically connected between the third and fourth electrodes ET3 and ET4. Similarly, a third serial stage may include a fifth electrode ET5, a sixth electrode ET6, and at least one third light emitting element LD3 electrically connected between the fifth and sixth electrodes ET5 and ET6, and a fourth serial stage may include a seventh electrode ET7, an eighth electrode ET8, and at least one fourth light emitting element LD4 electrically connected between the seventh and eighth electrodes ET7 and ET8.

A first electrode of the light source unit LSU, for example, the first electrode ET1, may be a first pixel electrode (or anode electrode). In addition, a last electrode of the light source unit LSU, for example, the eighth electrode ET8, may be a second pixel electrode (or cathode electrode).

The remaining electrodes of the light source unit LSU, for example, the second to seventh electrodes ET2 to ET7 may form respective middle electrodes. For example, the second electrode ET2 and the third electrode ET3 may be integrally or non-integrally connected to each other to form a first middle electrode IET1. Similarly, the fourth electrode ET4 and the fifth electrode ET5 may be integrally or non-integrally connected to each other to form a second middle electrode IET2, and the sixth electrode ET6 and seventh electrode ET7 may be integrally or non-integrally connected to each other to form a third middle electrode IET3. In such an embodiment, the second and third electrodes ET2 and ET3 may be combined to be considered as one first middle electrode IET1, the fourth and fifth electrodes ET4 and ET5 may be combined to be considered as one second middle electrode IET2, and the sixth and seventh electrodes ET6 and ET7 may be combined to be considered as one third middle electrode IET3.

A first end portion (e.g., p-type end portion) of the first light emitting element LD1 may be connected to the first power source VDD via the first pixel electrode (e.g., first electrode ET1) of the light source unit LSU. In addition, a second end portion (e.g., n-type end portion) of the first light emitting element LD1 may be connected to a first end portion (e.g., p-type end portion) of the second light emitting element LD2 through the first middle electrode IET1.

The first end portion (e.g., p-type end portion) of the second light emitting element LD2 may be connected to a second end portion (e.g., n-type end portion) of the first light emitting element LD1. In addition, the second end portion (e.g., n-type end portion) of the second light emitting element LD2 may be connected to a first end portion (e.g., p-type end portion) of the third light emitting element LD3 through the second middle electrode IET2.

The first end portion (e.g., p-type end portion) of the third light emitting element LD3 may be connected to a second end portion (e.g., n-type end portion) of the second light emitting element LD2. In addition, a second end portion of the third light emitting element LD3 (e.g., n-type end portion) may be connected a first end portion (e.g., p-type end portion) of the fourth light emitting element LD4 through the third middle electrode IET3.

A second end portion of the fourth light emitting element LD4 (e.g., n-type end portion) may be connected to the second power source VSS via the second pixel electrode (e.g., eighth electrode ET8) of the light source unit LSU. In the above-described manner, the first to fourth light emitting elements LD1 to LD4 may be sequentially connected in series between the first and second pixel electrodes of the light source unit LSU.

In FIG. 4, an embodiment in which the light emitting elements LD are connected in a 4-stage serial/parallel mixed structure is illustrated, but the present disclosure is not limited thereto. For example, in another embodiment, at least two light emitting elements LD may be connected in a 2-stage serial or serial/parallel mixed structure, or four or more light emitting elements LD may be connected in a 4-stages or more serial or serial/parallel mixed structure.

When the light source unit LSU is configured by using the light emitting elements LD having the same condition (e.g., the same size and/or number) as an effective light source, and when the light emitting elements LD are connected in a serial or serial/parallel mixed structure, power efficiency may be improved. For example, the light source unit LSU in which the light emitting elements LD are connected in series or in series/parallel may display higher luminance with the same current than a light source unit in which the light emitting elements LD are connected only in parallel. In addition, the light source unit LSU in which the light emitting elements LD are connected in series or in series/parallel may display the same luminance as that of a light source unit in which the light emitting elements LD are connected in parallel with a lower driving current. In addition, in the pixel PXL in which the light emitting elements LD are connected in a serial structure or in a serial/parallel mixed structure, even if a short circuit defect occurs at some of the serial stages, since a degree of luminance may be displayed through the light emitting elements LD in the remaining serial stages, the possibility of dark spot defects of the pixel PXL may be reduced.

Each of the light emitting elements LD may include a first end portion (e.g., p-type end portion) electrically connected to the first power source VDD via the first pixel electrode (e.g., first electrode ET1), the pixel circuit PXC, and/or the first power line PL1 and a second end portion (e.g., n-type end portion) electrically connected to the second power source VSS via the second pixel electrode (e.g., eighth electrode ET8) and the second power line PL2. For example, the light emitting elements LD may be connected in a forward direction between the first power source VDD and the second power source VSS. Respective light emitting elements LD connected in the forward direction as described above may configure respective effective light sources, and these effective light sources may be combined to form the light source unit LSU of the pixel PXL.

The first and second power sources VDD and VSS may have different potentials so that the light emitting elements LD may emit light. For example, the first power source VDD may be set as a high potential power source, and the second power source VSS may be set as a low potential power source. In this case, the first power source VDD and the second power source VSS may have a potential difference such that the light emitting elements LD may emit light during a light emitting period of the pixel PXL.

When a driving current is supplied through the corresponding pixel circuit PXC, the light emitting elements LD may emit light with a luminance corresponding to the driving current. For example, during each frame period, the pixel circuit PXC may supply a driving current corresponding to a gray value to be displayed in the corresponding frame to the light source unit LSU. Accordingly, while the light emitting elements LD emit light with a luminance corresponding to the driving current, the light source unit LSU may display the luminance corresponding to the driving current.

The pixel circuit PXC may be connected between the first power source VDD and the light source unit LSU. The pixel circuit PXC may be connected to a scan line Si and a data line Dj of the pixel PXL. For example, when the pixel PXL is disposed in an i-th horizontal line (row) (i being a natural number) and a j-th vertical line (column) (j being a natural number) of the display area DA, the pixel circuit PXC may be connected to an i-th scan line Si and a j-th data line Dj of the display area DA.

In some embodiments, the pixel circuit PXC may include a plurality of transistors and at least one capacitor. For example, the pixel circuit PXC may include a first transistor T1, a second transistor T2, and a storage capacitor Cst.

The first transistor T1 may be connected between the first power source VDD and the light source unit LSU. For example, a first electrode (e.g., a source electrode) of the first transistor T1 may be connected to the first power source VDD, and a second electrode (e.g., a drain electrode) of the first transistor T1 may be connected to the first electrode ET1. A gate electrode of the first transistor T1 may be coupled to a first node N1. The first transistor T1 may control a driving current supplied to the light source unit LSU in response to a voltage of the first node N1. For example, the first transistor T1 may be a driving transistor that controls a driving current of the pixel PXL.

The second transistor T2 may be connected between the data line Dj and the first node N1. For example, a first electrode (e.g., a source electrode) of the second transistor T2 may be connected to the data line Dj, and a second electrode (e.g., a drain electrode) of the second transistor T2 may be connected to the first node N1. A gate electrode of the second transistor T2 may be connected to the scan line Si. When a scan signal SSi of a gate-on voltage (e.g., a low level voltage) may be supplied from the scan line Si, the second transistor T2 is turned on to electrically connect the data line Dj and the first node N1.

For each frame period, a data signal DSj of the corresponding frame is supplied to the data line Dj, and the data signal DSj may be transmitted to the first node N1 through the turned-on transistor T2 during a period in which the scan signal SSi of the gate-on voltage is supplied. For example, the second transistor T2 may be a switching transistor for transmitting each data signal DSj to the inside of the pixel PXL (e.g., to the first transistor T1).

One electrode of the storage capacitor Cst may be connected to the first power source VDD, and the other electrode thereof is connected to the first node N1. The storage capacitor Cst may be charged with a voltage corresponding to the data signal DSj supplied to the first node N1 during each frame period.

In some embodiments, the pixel circuit PXC may be further connected to a sensing control line SCLi and a sensing line SLj. For example, the pixel circuit PXC of the pixel PXL disposed at an i-th horizontal line and a j-th vertical line of the display area DA may be connected to an i-th sensing control line SCLi and a j-th sensing line SLj of the display area DA. The pixel circuit PXC may further include a third transistor T3. However, it is not necessarily limited thereto, in some embodiments, the sensing line SLj may be omitted, and the characteristics of the pixel PXL may also be detected by detecting a sensing signal SENj through the data line Dj of the corresponding pixel PXL (or adjacent pixel).

The third transistor T3 may be connected between the first transistor T1 and the sensing line SLj. For example, one electrode of the third transistor T3 may be connected to one electrode (e.g., a source electrode) of the first transistor T1 connected to the first electrode ET1, and the other electrode thereof may be connected to the sensing line SLj. When the sensing line SLj is omitted, the other electrode of the third transistor T3 may also be connected to the data line Dj.

A gate electrode of the third transistor T3 may be connected to the sensing control line SCLi. When the sensing control line SCLi is omitted, the gate electrode of the third transistor T3 may be connected to the scan line Si. The third transistor T3 may be turned on by a sensing control signal SCSi of a gate-on voltage (e.g., a high level voltage) supplied to the sensing control line SCLi during a sensing period (e.g., a predetermined sensing period) to electrically connect the sensing line SLj and the first transistor T1.

In some embodiments, the sensing period may be a period for extracting characteristics (e.g., a threshold voltage of the first transistor T1) of each of the pixels PXL disposed in the display area DA. During the sensing period, the first transistor T1 may be turned on by supplying a reference voltage (e.g., a predetermined reference voltage) at which the first transistor T1 may be turned on to the first node N1 through the data line Dj and the second transistor T2 and by connecting each pixel PXL to a current source or the like. In addition, by supplying the sensing control signal SCSi of a gate-on voltage to the third transistor T3 to turn on the third transistor T3, the first transistor T1 may be connected to the sensing line SLj. Thereafter, the sensing signal SENj is obtained through the sensing line SLj, and the characteristics of each pixel PXL, in addition to the threshold voltage of the first transistor T1, may be detected by using the sensing signal SENj. Information on the characteristics of each pixel PXL may be used to convert image data so that a characteristic difference between the pixels PXL disposed in the display area DA may be compensated.

FIG. 4 illustrates an embodiment in which the first to third transistors T1, T2, and T3 are all n-type transistors, but the present disclosure is not limited thereto. For example, at least one of the first to third transistors T1, T2, and T3 may be changed to a p-type transistor. In addition, the pixel circuit PXC may be configured as a pixel circuit having various suitable structures and/or driving methods. For example, additional circuit elements, such as a transistor for compensating for a threshold voltage of the first transistor T1, a transistor for initializing a voltage of the first node N1 or the first electrode ET1 of the light source unit LSU, a transistor for controlling a period in which a driving current is supplied to the light source unit LSU, and/or a boosting capacitor for boosting the voltage of the first node N1, may be further included.

Figure 5:
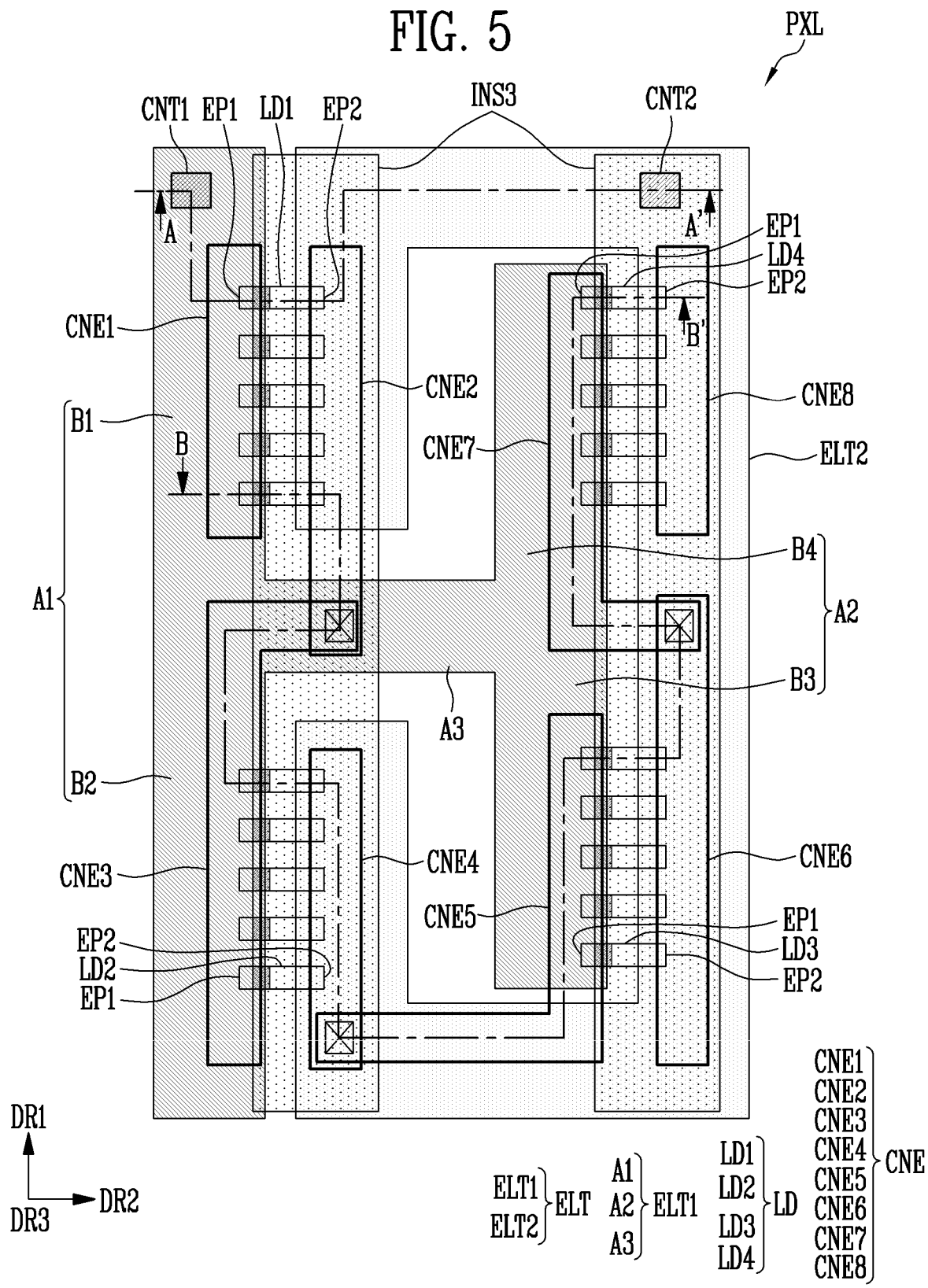
FIG. 5 illustrates a top plan view of a display device according to an embodiment.
Figure 6:
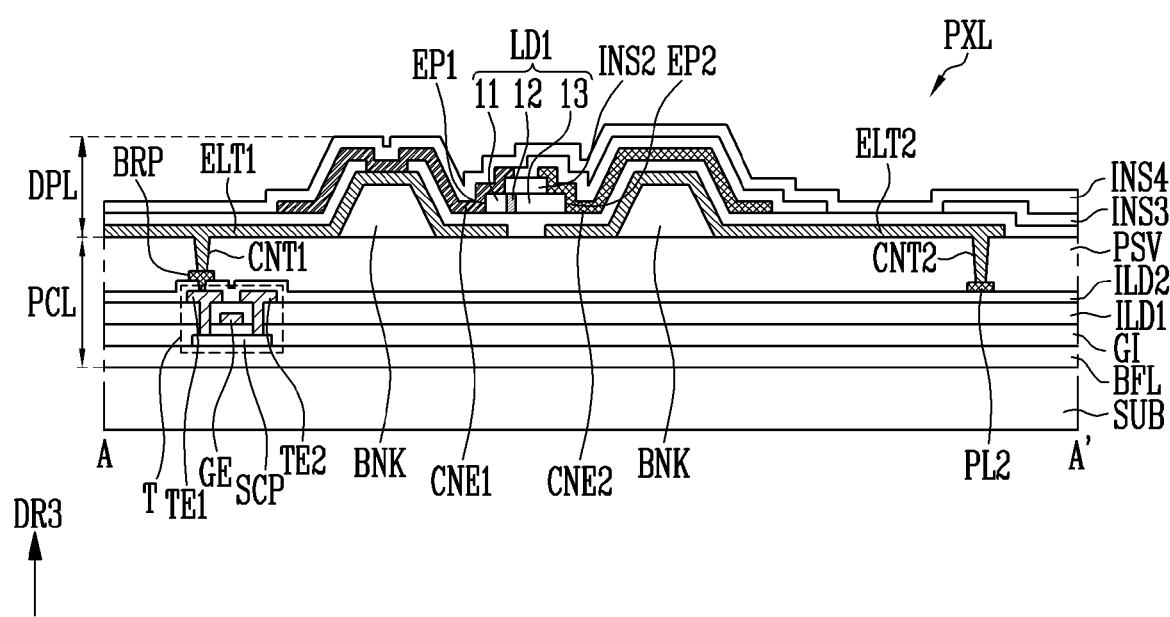
FIG. 6 illustrates a cross-sectional view taken along the line A-A' of FIG. 5.
Figure 7:
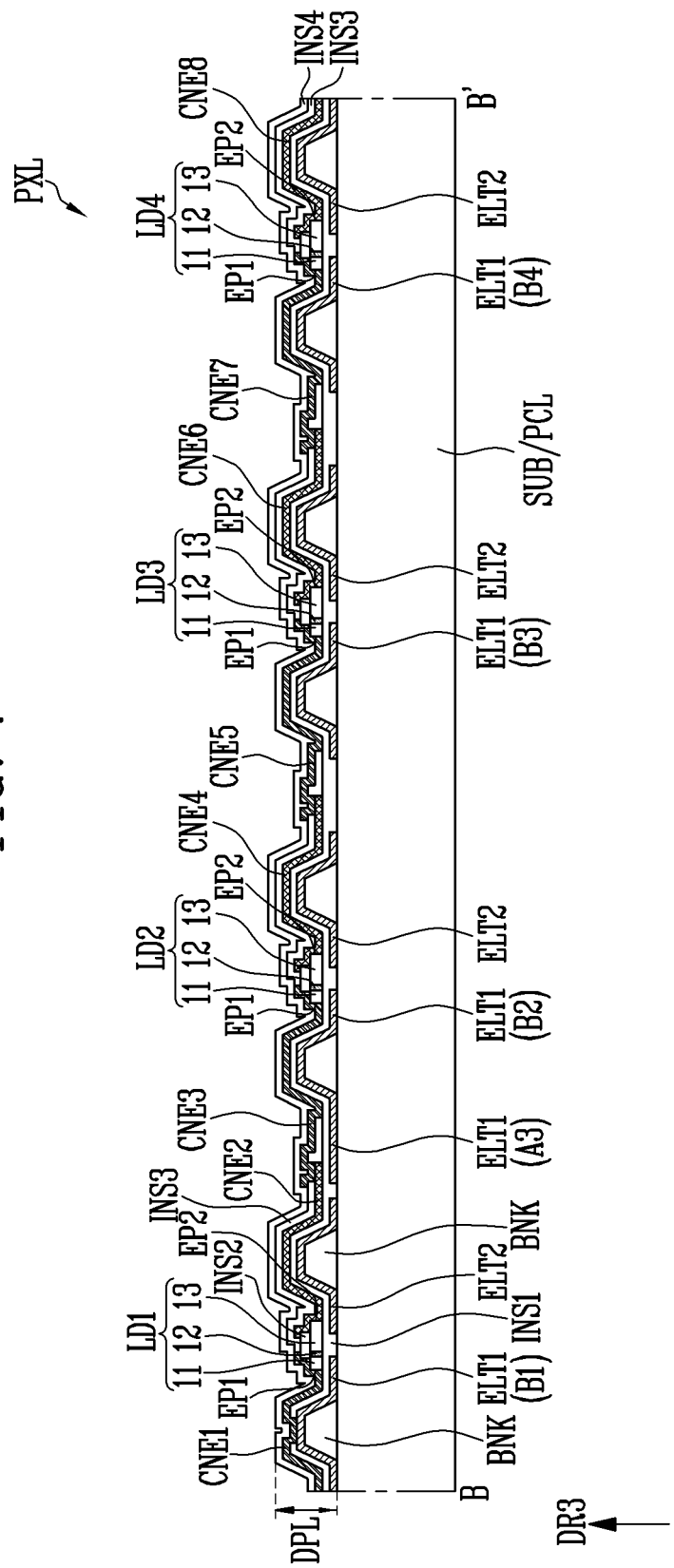
FIG. 7 illustrates a cross-sectional view taken along the line B-B' of FIG. 5.

FIG. 5 illustrates a top plan view of a display device according to an embodiment, FIG. 6 illustrates a cross-sectional view taken along the line A-A' of FIG. 5, and FIG. 7 illustrates a cross-sectional view taken along the line B-B' of FIG. 5.

As an example, the pixel PXL illustrated in FIG. 5 may be one of the first to third pixels PXL1, PXL2, and PXL3 configuring the pixel unit PXU shown in FIG. 3, and the first to third pixels PXL1, PXL2, and PXL3 may be substantially the same or similar to each other. In addition, FIG. 5 illustrates an embodiment in which each pixel PXL includes the light emitting elements LD disposed in four serial stages as shown in FIG. 4, but the number of serial stages of each pixel PXL may be variously changed according to embodiments.

Referring to FIG. 5, each of the pixels PXL may include first and second pixel electrodes ELT1 and ELT2, first to fourth light emitting elements LD1 to LD4, and first to eighth contact electrodes CNE1 to CNE8. Hereinafter, when the first and second pixel electrodes ELT1 and ELT2 are arbitrarily referred to as at least one pixel electrode, they will be referred to as a "pixel electrode ELT" or "pixel electrodes ELT". In addition, when arbitrarily referring to at least one light emitting element of the first to fourth light emitting elements LD1 to LD4 or comprehensively referring to two or more of the light emitting elements, it or they will be referred to as a "light emitting element LD" or "light emitting elements LD," and when arbitrarily referring to at least one contact electrode of contact electrodes including the first to eighth contact electrodes CNE1 to CNE8, it or they will be referred to as a "contact electrode CNE" or "contact electrodes CNE".

The first pixel electrode ELT1 may include the first area A1, the second area A2, and a third area A3 disposed between the first area A1 and the second area A2. The first area A1 and the second area A2 of the first pixel electrode ELT1 may extend in a first direction DR1 and may be spaced apart from each other by an interval in a second direction DR2 crossing the first direction DR1. The third area A3 of the first pixel electrode ELT1 may extend in the second direction DR2 between the first and second areas A1 and A2.

The first and second areas A1 and A2 of the first pixel electrode ELT1 may each include a plurality of branch areas B1, B2, B3, and B4 branched from one end and the other end of the third area A3. For example, the first area A1 of the first pixel electrode ELT1 may include the first branch area B1 extending from one end of the third area A3 in the first direction DR1 and the second branch area B2 extending from one end of the third area A3 in an opposite direction of the first direction DR1. In addition, the second area A2 of the first pixel electrode ELT1 may include the third branch area B3 extending from the other end of the third area A3 in an opposite direction of the first direction DR1, and the fourth branch area B4 extending from the other end of the third area A3 in the first direction DR1.

The second pixel electrode ELT2 may be spaced apart from the first pixel electrode ELT1, and in the illustrated embodiment, may be disposed to surround (e.g., to extend around a periphery of) at least a portion of the first pixel electrode ELT1. For example, the second pixel electrode ELT2 may be disposed to surround the second area A2 of the first pixel electrode ELT1. For example, the second pixel electrode ELT2 may extend to surround the third branch area B3 and the fourth branch area B4 of the first pixel electrode ELT1, and one end of the second pixel electrode ELT2 may face the first branch area B1 of the first pixel electrode ELT1, and the other end of the second pixel electrode ELT2 may face the second branch area B2 of the first pixel electrode ELT1. However, it is not necessarily limited thereto, and the shape and/or mutual disposition structure of each of the first and second pixel electrodes ELT1 and ELT2 may be variously changed according to embodiments.

One of the above-described pixel electrodes ELT, for example, the first pixel electrode ELT1, may be electrically connected to the pixel circuit PXC and/or the first power line PL1 through a first contact portion CNT1. The other of the pixel electrodes ELT, for example, the second pixel electrode ELT2, may be electrically connected to the second power line PL2 through a second contact portion CNT2. For example, the first pixel electrode ELT1 may correspond to the first electrode ET1 of FIG. 4, and the second pixel electrode ELT2 may correspond to the eighth electrode ET8 of FIG. 4.

The light emitting elements LD may be disposed between the first and second pixel electrodes ELT1 and ELT2. The light emitting elements LD may be directionally aligned between the first and second pixel electrodes ELT1 and ELT2. For example, the light emitting elements LD may be disposed so that the first end portion EP1 faces the first pixel electrode ELT1 and the second end portion EP2 faces the second pixel electrode ELT2.

In an embodiment, the first and second light emitting elements LD1 and LD2 may be disposed between the first area A1 of the first pixel electrode ELT1 and the second pixel electrode ELT2. The third and fourth light emitting elements LD3 and LD4 may be disposed between the second area A2 of the first pixel electrode ELT1 and the second pixel electrode ELT2.

For example, the first light emitting element LD1 may be disposed between the first branch area B1 of the first pixel electrode ELT1 and the second pixel electrode ELT2. The second light emitting element LD2 may be disposed between the second branch area B2 of the first pixel electrode ELT1 and the second pixel electrode ELT2. The third light emitting element LD3 may be disposed between the third branch area B3 of the first pixel electrode ELT1 and the second pixel electrode ELT2. The fourth light emitting element LD4 may be disposed between the fourth branch area B4 of the first pixel electrode ELT1 and the second pixel electrode ELT2.

The light emitting elements LD may be electrically connected to the first and second pixel electrodes ELT1 and ELT2 through the contact electrodes CNE.

The first contact electrode CNE1 may be disposed on the first pixel electrode ELT1 and the first end portion EP1 of the first light emitting element LD1. The first contact electrode CNE1 may overlap the first branch area B1 of the first pixel electrode ELT1 and/or the first end portion EP1 of the first light emitting element LD1 in a third direction DR3. The first contact electrode CNE1 may contact the first pixel electrode ELT1 and the first end portion EP1 of the first light emitting element LD1. For example, the first contact electrode CNE1 may electrically connect the first pixel electrode ELT1 and the first light emitting element LD1.

The second contact electrode CNE2 may be disposed on the second end portion EP2 of the first light emitting element LD1. The second contact electrode CNE2 may overlap the second end portion EP2 of the first light emitting element LD1 in the third direction DR3. In addition, the second contact electrode CNE2 may overlap the second pixel electrode ELT2 in the third direction DR3. The second contact electrode CNE2 may contact the second end portion EP2 of the first light emitting element LD1. In an embodiment, the second contact electrode CNE2 may correspond to the second electrode ET2 of FIG. 4.

The third contact electrode CNE3 may be disposed on the first end portion EP1 of the second light emitting element LD2. The third contact electrode CNE3 may overlap the first end portion EP1 of the second light emitting element LD2 in the third direction DR3. In addition, the third contact electrode CNE3 may overlap the second branch area B2 of the first pixel electrode ELT1 in the third direction DR3. The third contact electrode CNE3 may contact the second contact electrode CNE2 and the first end portion EP1 of the second light emitting element LD2. For example, the third contact electrode CNE3 may electrically connect the second contact electrode CNE2 and the second light emitting element LD2. For example, the third contact electrode CNE3 may be disposed on a different layer from the second contact electrode CNE2 and may contact the second contact electrode CNE2 through a separate contact opening (e.g., contact hole). Accordingly, the second end portion EP2 of the first light emitting element LD1 may be connected to the first end portion EP1 of the second light emitting element LD2 through the second and third contact electrodes CNE2 and CNE3. For example, the third contact electrode CNE3 may correspond to the third electrode ET3 of FIG. 4.

The fourth contact electrode CNE4 may be disposed on the second end portion EP2 of the second light emitting element LD2. The fourth contact electrode CNE4 may overlap the second end portion EP2 of the second light emitting element LD2 in the third direction DR3. In addition, the fourth contact electrode CNE4 may overlap the second pixel electrode ELT2 in the third direction DR3. The fourth contact electrode CNE4 may contact the second end portion EP2 of the second light emitting element LD2. For example, the fourth contact electrode CNE4 may correspond to the fourth electrode ET4 of FIG. 4.

The fifth contact electrode CNE5 may be disposed on the first end portion EP1 of the third light emitting element LD3. The fifth contact electrode CNE5 may overlap the first end portion EP1 of the third light emitting element LD3 in the third direction DR3. In addition, the fifth contact electrode CNE5 may overlap the third branch area B3 of the first pixel electrode ELT1 in the third direction DR3. The fifth contact electrode CNE5 may contact the fourth contact electrode CNE4 and the first end portion EP1 of the third light emitting element LD3. For example, the fifth contact electrode CNE5 may electrically connect the fourth contact electrode CNE4 and the third light emitting element LD3. For example, the fifth contact electrode CNE5 may be disposed on a different layer from the fourth contact electrode CNE4 and may contact the fourth contact electrode CNE4 through a separate contact opening. Accordingly, the second end portion EP2 of the second light emitting element LD2 may be connected to the first end portion EP1 of the third light emitting element LD3 through the fourth and fifth contact electrodes CNE4 and CNE5. For example, the fifth contact electrode CNE5 may correspond to the fifth electrode ET5 of FIG. 4.

The sixth contact electrode CNE6 may be disposed on the second end portion EP2 of the third light emitting element LD3. The sixth contact electrode CNE6 may overlap the second end portion EP2 of the third light emitting element LD3 in the third direction DR3. In addition, the sixth contact electrode CNE6 may overlap the second pixel electrode ELT2 in the third direction DR3. The sixth contact electrode CNE6 may contact the second end portion EP2 of the third light emitting element LD3. For example, the sixth contact electrode CNE6 may correspond to the sixth electrode ET6 of FIG. 4.

The seventh contact electrode CNE7 may be disposed on the first end portion EP1 of the fourth light emitting element LD4. The seventh contact electrode CNE7 may overlap the first end portion EP1 of the fourth light emitting element LD4 in the third direction DR3. In addition, the seventh contact electrode CNE7 may overlap the fourth branch area B4 of the first pixel electrode ELT1 in the third direction DR3. The seventh contact electrode CNE7 may contact the sixth contact electrode CNE6 and the first end portion EP1 of the fourth light emitting element LD4. For example, the seventh contact electrode CNE7 may electrically connect the sixth contact electrode CNE6 and the fourth light emitting element LD4. For example, the seventh contact electrode CNE7 may be disposed on a different layer from the sixth contact electrode CNE6 and may contact the sixth contact electrode CNE6 through a separate contact opening. Accordingly, the second end portion EP2 of the third light emitting element LD3 may be connected to the first end portion EP1 of the fourth light emitting element LD4 through the sixth and seventh contact electrodes CNE6 and CNE7. For example, the seventh contact electrode CNE7 may correspond to the seventh electrode ET7 of FIG. 4.

The eighth contact electrode CNE8 may be disposed on the second pixel electrode ELT2 and the second end portion EP2 of the fourth light emitting element LD4. The eighth contact electrode CNE8 may overlap the second pixel electrode ELT2 and/or the second end portion EP2 of the fourth light emitting element LD4 in third direction DR3. The eighth contact electrode CNE8 may contact the second pixel electrode ELT2 and the second end portion EP2 of the fourth light emitting element LD4. For example, the eighth contact electrode CNE8 may electrically connect the second pixel electrode ELT2 and the fourth light emitting element LD4.

In an embodiment, each pixel PXL may further include an insulation layer covering at least some of the contact electrodes CNE. For example, a third insulation layer INS3 may be disposed on the second, fourth, sixth, and eighth contact electrodes CNE2, CNE4, CNE6, and CNE8. In such an embodiment, the third insulation layer INS3 overlaps the second end portion EP2 of the light emitting elements LD in the third direction DR3, and it may be disposed to not overlap (e.g., it may expose) the first end portion EP1 of the light emitting elements LD in the third direction DR3. When the third insulation layer INS3 does not overlap the first end portion EP1 (e.g., the first semiconductor layer 11) of the light emitting elements LD that exhibit a relatively large amount of light emission, the light emission efficiency of the light emitting elements LD may not be deteriorated (or substantially deteriorated) due to the third insulation layer INS3.

FIG. 5 illustrates an embodiment in which the third insulation layer INS3 has a stripe shape on the second, fourth, sixth, and eighth contact electrodes CNE2, CNE4, CNE6, and CNE8, but present disclosure is not limited thereto. For example, the shape or disposition structure of the third insulation layer INS3 may be variously changed within a range in which the third insulation layer INS3 does not overlap the first end portion EP1 of the light emitting elements LD. For example, in some embodiments, the third insulation layer INS3 may be disposed on an entire surface of the pixel PXL, and in such an embodiment, it may have an opening exposing the first end portion EP1 of the light emitting elements LD.

Hereinafter, a cross-sectional structure of the pixel PXL shown in FIG. 5 will be described, in detail, with reference to FIGS. 6 and 7 based on the light emitting element LD. FIG. 6 schematically illustrates a structure of the pixel PXL based on the first light emitting element LD1 and a transistor T (e.g., the first transistor T1 of FIG. 4) connected to the first pixel electrode ELT1 from among various circuit elements configuring the pixel circuit PXC. Hereinafter, when it is not necessary to separately specify the first transistor T1, the first transistor T1 will be comprehensively referred to as a "transistor T". Further, structures of the transistors T and/or a position of each layer thereof are not limited to the embodiment shown in FIG. 6, and they may be variously changed according to embodiments. In addition, the transistors T included in each pixel circuit PXC may have substantially the same or similar structure to each other, but are not limited thereto. For example, in another embodiment, at least one of the transistors T included in the pixel circuit PXC may have a different cross-sectional structure from the remaining other transistors T and/or may be disposed on a different layer.

FIG. 7 illustrates an electrical connection structure between the light emitting elements LD and the contact electrodes CNE, and for better understanding and ease of description, the circuit layer PCL and the like are omitted.

Referring to FIGS. 6 and 7, the pixel PXL and the display device including the same may include a substrate SUB, and a circuit layer PCL and a display layer DPL that are disposed on one surface of the substrate SUB. In some embodiments, a color conversion layer and/or a color filter layer may be further disposed on the display layer DPL, but the present disclosure is not limited thereto.

The circuit layer PCL may include circuit elements for configuring the pixel circuit PXC of each pixel PXL and various wires connected to the circuit elements. The display layer DPL includes electrodes (e.g., the pixel electrodes ELT and/or the contact electrodes CNE) and the light emitting elements LD that configure the light source unit LSU of each pixel PXL.

The circuit layer PCL may include a plurality of transistors T configuring the pixel circuit PXC. In addition, the circuit layer PCL may further include at least one power line and/or signal line connected to each pixel circuit PXC and/or light source unit LSU. For example, the circuit layer PCL may include the first power line PL1, the second power line PL2, and the scan line Si and the data line Dj of each pixel PXL. In addition, the circuit layer PCL may include a plurality of insulation layers. For example, the circuit layer PCL may include a buffer layer BFL, a gate insulation layer GI, a first interlayer insulation layer ILD1, a second interlayer insulation layer ILD2, and/or a passivation layer PSV sequentially stacked on one side of the substrate SUB. In addition, the circuit layer PCL may selectively further include at least one light blocking pattern and the like disposed under at least some of the transistors T.

The buffer layer BFL may prevent (or substantially prevent) impurities from diffusing into each circuit element. The buffer layer BFL may be a single layer but may have a multilayer structure including a plurality of layers (e.g., at least two layers or more). When the buffer layer BFL has the multilayer structure, respective layers may include (or may be made of) the same material or different materials. The buffer layer BFL may be omitted in some embodiments. When the buffer layer BFL is omitted, at least one circuit element and/or wire may be directly disposed on one surface of the substrate SUB.

Each transistor T may include a semiconductor pattern SCP, a gate electrode GE, and first and second transistor electrodes TE1 and TE2. FIG. 6 illustrate an embodiment in which each transistor T includes the first and second transistor electrodes TE1 and TE2 formed separately from the semiconductor pattern SCP, but the present disclosure is not necessarily limited thereto. For example, in another embodiment, the first and/or second transistor electrodes TE1 and/or TE2 provided in at least one transistor T may be integrated with the corresponding semiconductor pattern SCP.

The semiconductor pattern SCP may be disposed on the buffer layer BFL. For example, the semiconductor pattern SCP may be disposed between the substrate SUB on which the buffer layer BFL is formed and the gate insulation layer GI. The semiconductor pattern SCP may include a first region contacting each first transistor electrode TE1, a second region contacting each second transistor electrode TE2, and a channel region disposed between the first and second regions. In some embodiments, one of the first and second regions may be a source region, and the other thereof may be a drain region.

In some embodiments, the semiconductor pattern SCP may be a semiconductor pattern including (or made of) polysilicon, amorphous silicon, an oxide semiconductor, or the like. In addition, the channel region of the semiconductor pattern SCP may be an intrinsic semiconductor (e.g., a semiconductor pattern that is not doped with impurities), and each of the first and second regions of the semiconductor pattern SCP may be a semiconductor pattern doped with impurities (e.g., predetermined impurities).

In an embodiment, the semiconductor patterns SCP of the transistors T included in each pixel circuit PXC may include (or may be made of) substantially the same or similar material. For example, the semiconductor pattern SCP of the transistors T may include (or may be one of a material of) polysilicon, amorphous silicon, and an oxide semiconductor.

In another embodiment, some of the transistors T and the remaining some thereof may include the semiconductor patterns SCP including (or made of) different materials. For example, the semiconductor pattern SCP of some of the transistors T may include (or may be made of) polysilicon or amorphous silicon, and the semiconductor pattern SCP of the remaining some of the transistors T may include (or may be made of) an oxide semiconductor.

The gate insulation layer GI may be disposed on the semiconductor pattern SCP. For example, the gate insulation layer GI may be disposed between the semiconductor pattern SCP and the gate electrode GE. The gate insulation layer GI may be a single layer or may have a multilayer structure and may include a silicon nitride ($SiN_x$), a silicon oxide ($SiO_x$), or a silicon oxynitride ($SiO_xN_y$), and various suitable types of organic/inorganic insulation materials.

The gate electrode GE may be disposed on the gate insulation layer GI. For example, the gate electrode GE may be disposed to overlap the semiconductor pattern SCP with the gate insulation layer GI interposed therebetween. FIG. 6 illustrates a top-gate structure of transistor T, but in another embodiment, the transistor T may have a bottom-gate structure. In such an embodiment, the gate electrode GE may be disposed to overlap the semiconductor pattern SCP under the semiconductor pattern SCP.

The first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be a single layer or may have a multilayer structure and may include at least one inorganic insulation material and/or organic insulation material. For example, the first interlayer insulation layer ILD1 may include a silicon nitride ($SiN_x$), a silicon oxide ($SiO_x$), or a silicon oxynitride ($SiO_xN_y$), and various suitable types of organic/inorganic insulation materials. However, the materials included in the first interlayer insulation layer ILD1 are not particularly limited.

The first and second transistor electrodes TE1 and TE2 may be disposed on each semiconductor pattern SCP with at least one first interlayer insulation layer ILD1 therebetween. For example, the first and second transistor electrodes TE1 and TE2 may be disposed on different end portions of the semiconductor pattern SCP with the gate insulation layer GI and the first interlayer insulation layer ILD1 therebetween. The first and second transistor electrodes TE1 and TE2 may be electrically connected to each semiconductor pattern SCP. For example, the first and second transistor electrodes TE1 and TE2 may be connected to the first and second regions of the semiconductor pattern SCP through respective contact openings passing through the gate insulation layer GI and the first interlayer insulation layer ILD1. In some embodiments, one of the first and second transistor electrodes TE1 and TE2 may be a source electrode, and the other thereof may be a drain electrode.

At least one transistor T provided in the pixel circuit PXC may be connected to at least one pixel electrode. For example, the transistor T may be electrically connected to the first pixel electrode ELT1 through a contact opening (e.g., a first contact opening CH1) and/or a bridge pattern BRP passing through the passivation layer PSV.

In an embodiment, at least one signal line and/or power line connected to each pixel PXL may be disposed on the same layer as one electrode of circuit elements included in the pixel circuit PXC. For example, the scan line Si of each pixel PXL may be disposed on the same layer as the gate electrodes GE of transistors T, and the data line Dj of each pixel PXL may be disposed on the same layer as the first and second transistor electrodes TE1 and TE2 of transistors T.

The first and/or second power lines PL1 and PL2 may be disposed on the same layer as or different layers from the gate electrodes GE or first and second transistor electrodes TE1 and TE2 of the transistors T. For example, the second power line PL2 for supplying the second power source VSS may be disposed on the second interlayer insulation layer ILD2 to be at least partially covered by the passivation layer PSV. The second power line PL2 may be electrically connected to the second pixel electrode ELT2 of the light source unit LSU disposed on the passivation layer PSV through a contact opening passing through the passivation layer PSV. However, the position and/or structure of the first and/or second power lines PL1 and PL2 may be variously changed. For example, the second power line PL2 may be disposed on the same layer as the gate electrodes GE of the transistors T or the first and second transistor electrodes TE1 and TE2 to be electrically connected to the second pixel electrode ELT2 through at least one bridge pattern and/or the contact opening.

The second interlayer insulation layer ILD2 may be disposed at an upper portion of the first interlayer insulation layer ILD1 and may cover the first and second transistor electrodes TE1 and TE2 disposed on the first interlayer insulation layer ILD1. The second interlayer insulation layer ILD2 may be a single layer or may have a multilayer structure and may include at least one inorganic insulation material and/or organic insulation material. For example, the second interlayer insulation layer ILD2 may include a silicon nitride ($SiN_x$), a silicon oxide ($SiO_x$), or a silicon oxynitride ($SiO_xN_y$), and various suitable types of organic/inorganic insulation materials, but is not necessarily limited thereto.

The bridge pattern BRP, the first power line PL1, and/or the second power line PL2 for connecting at least one circuit element (e.g., the first transistor T1) provided in the pixel circuit PXC and the first electrode ELT1 may be disposed on the second interlayer insulation layer ILD2.

The passivation layer PSV may be disposed on the circuit elements including the transistors T and/or on the wires including the first and second power lines PL1 and PL2. The passivation layer PSV may be a single layer or may have a multilayer structure and may include at least one inorganic insulation material and/or organic insulation material. For example, the passivation layer PSV may include at least one organic insulation layer and may substantially flatten a surface of the circuit layer PCL.

The display layer DPL may be disposed on the passivation layer PSV of the circuit layer PCL. The display layer DPL includes electrodes (e.g., the pixel electrodes ELT and/or the contact electrodes CNE) and the light emitting elements LD that configure the light source unit LSU of each pixel PXL.

The display layer DPL may include a bank BNK protruding in the third direction DR3 on the substrate SUB. The bank BNK may be formed in a separate or integral pattern on the circuit layer PCL.

The bank BNK may have various shapes according to embodiments. In an embodiment, the bank BNK may be a bank structure having a positive taper structure. For example, the bank BNK may have an inclined surface inclined at an angle (e.g., a predetermined angle) with respect to the substrate SUB as shown in FIGS. 6 and 7. However, the present disclosure is not necessarily limited thereto, and the bank BNK may have a side wall having a curved surface or a step shape. For example, the bank BNK may have a cross-sectional shape of a semicircle or semi-ellipse.

Electrodes and insulation layers disposed at an upper portion of bank BNK may have a shape corresponding to the bank BNK1. For example, the pixel electrodes ELT and the contact electrodes CNE may be disposed on an upper portion of the bank BNK and may have an inclined or curved surface having a shape corresponding to the shape of the bank BNK. As an example, the bank BNK may function as a reflective member that guides light emitted from the light emitting elements LD together with the pixel electrodes ELT provided on an upper portion thereof to a front direction of the pixel PXL, that is, the third direction DR3, to improve the light emission efficiency of the display panel PNL.

The bank BNK may include an insulation material including at least one inorganic material and/or an organic material. For example, the bank BNK may include at least one layer of inorganic film that includes various suitable inorganic insulation materials including a silicon nitride ($SiN_x$) or a silicon oxide ($SiO_x$). In other embodiments, the bank BNK may include at least one layer of organic film and/or photo resist film that include various suitable organic insulation materials, or may include a single-layered or multi-layered insulator complexly including organic/inorganic materials. For example, the material and/or pattern shape of the bank BNK may be variously, suitably changed.

The first and second pixel electrodes ELT1 and ELT2 of each pixel PXL may be disposed on the upper portion of the bank BNK. The first and second pixel electrodes ELT1 and ELT2 may be disposed to be spaced apart from each other.

In some embodiments, the first and second pixel electrodes ELT1 and ELT2 may have a pattern separated for each pixel PXL or a pattern that is commonly connected to a plurality of pixels PXL. On the other hand, before the process of forming the pixel PXL, particularly the alignment of the light emitting elements LD is completed, the first pixel electrodes ELT1 of the pixels PXL are connected to each other, and the second pixel electrodes ELT2 thereof may be connected to each other. For example, before the alignment of the light emitting elements LD is completed, the first pixel electrodes ELT1 of the pixels PXL may be integrally formed with each other to form one first alignment electrode, and the second pixel electrodes ELT2 thereof may be integrally formed with each other to form one second alignment electrode. However, it is not necessarily limited thereto, and the first and second pixel electrodes ELT1 and ELT2 of the pixels PXL may each non-integrally (or separately) formed and may be electrically connected to each other by at least one contact opening and/or bridge pattern.

The first and second pixel electrodes ELT1 and ELT2 may receive a first alignment signal (or first alignment voltage) and a second alignment signal (or second alignment voltage), respectively, in an alignment step of the light emitting elements LD. For example, one of the first and second pixel electrodes ELT1 and ELT2 may be supplied with an AC-type alignment signal, and the other of the first and second pixel electrodes ELT1 and ELT2 may be supplied with an alignment voltage (e.g., a ground voltage) having a constant voltage level. For example, an alignment signal (e.g., a predetermined alignment signal) may be applied to the first and second pixel electrodes ELT1 and ELT2 in the alignment process of the light emitting elements LD. Accordingly, an electric field may be formed between the first and second pixel electrodes ELT1 and ELT2. The light emitting elements LD provided in each of the pixels PXL may be aligned between the first and second electrodes ELT1 and ELT2 by the electric field. After the alignment of the light emitting elements LD is completed, the pixels PXL may be formed in a form capable of being individually driven by disconnecting the first and second pixel electrodes ELT1 and ELT2 between the pixels PXL.

The first pixel electrode ELT1 may be electrically connected to a circuit element (e.g., at least one transistor configuring the pixel circuit PXC), a power line (e.g., the first power line PL1), and/or a signal line (e.g., the scan line Si, the data line Dj, or a control line), through the first contact portion CNT1. In the embodiment, the first pixel electrode ELT1 may be electrically connected to the bridge pattern BRP through the first contact portion CNT1, and thus, it may be electrically connected to the transistor T. However, the present disclosure is not necessarily limited thereto, and the first pixel electrode ELT1 may be directly connected to a power line or signal line.

The second pixel electrode ELT2 may be electrically connected to a circuit element (e.g., at least one transistor configuring the pixel circuit PXC), a power line (e.g., the second power line PL2), and/or a signal line (e.g., the scan line Si, the data line Dj, or a control line), through the second contact portion CNT2. In the embodiment, the second pixel electrode ELT2 may be electrically connected to the second power line PL2 through the second contact portion CNT2. However, the present disclosure is not necessarily limited thereto, and the second pixel electrode ELT2 may be directly connected to a power line or signal line.

Each of the first and second pixel electrodes ELT1 and ELT2 may include at least one conductive material. For example, each of the first and second pixel electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide, such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO); and at least one conductive material from among conductive polymers, such as PEDOT, but the first and second pixel electrodes ELT1 and ELT2 are not limited thereto. For example, each of the first and second pixel electrodes ELT1 and ELT2 may include other conductive materials in addition to a carbon nanotube or graphene. In addition, each of the first and second pixel electrodes ELT1 and ELT2 may be a single layer or may have a multilayer structure. For example, each of the first and second pixel electrodes ELT1 and ELT2 may include a reflective electrode layer including a reflective conductive material. In addition, each of the first and second pixel electrodes ELT1 and ELT2 may selectively further include at least one of a transparent electrode layer disposed at an upper portion and/or a lower portion of the reflective electrode layer and at least one conductive capping layer covering an upper portion of the reflective electrode layer and/or the transparent electrode layer.

A first insulation layer INS1 may be disposed on one area of the first and second pixel electrodes ELT1 and ELT2. The first insulation layer INS1 may be a single layer or may have a multilayer structure and may include at least one inorganic insulation material and/or organic insulation material. For example, the first insulation layer INS1 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

The light emitting elements LD may be provided and arranged on the first and second pixel electrodes ELT1 and ELT2 and the first insulation layer INS1. For example, the light emitting elements LD may be supplied to each pixel PXL through an inkjet method, a slit coating method, or other various methods, and the light emitting elements LD may be aligned between the first and second pixel electrodes ELT1 and ELT2 with directionality by an alignment signal (or alignment voltage) (e.g., a predetermined alignment signal or voltage) applied to each of the first and second pixel electrodes ELT1 and ELT2. For example, the light emitting elements LD may be disposed between the first and second pixel electrodes ELT1 and ELT2 so that the first end portion EP1 faces the first pixel electrode ELT1 and the second end portion EP2 faces the second pixel electrode ELT2.

A second insulation layer INS2 may be disposed on one area of the light emitting elements LD. For example, the second insulation layer INS2 may be disposed on one area of each of the light emitting elements LD to expose the first and second end portions EP1 and EP2 of each of the light emitting elements LD. For example, the second insulation layer INS2 may be locally disposed at an upper portion of one area including a central area of each of the light emitting elements LD. When the second insulation layer INS2 is formed on the light emitting elements LD after the alignment of the light emitting elements LD is completed, it is possible to prevent the light emitting elements LD from deviating from an aligned position.

The second insulation layer INS2 may be formed in an independent pattern in each pixel PXL, but it is not limited thereto. In some embodiments, the second insulation layer INS2 may be omitted, and in such an embodiment, the contact electrodes CNE may be directly disposed on the light emitting elements LD.

The second insulation layer INS2 may be a single layer or may have a multilayer structure and may include at least one inorganic insulation material and/or organic insulation material. For example, the second insulation layer INS2 may include a silicon nitride ($SiN_x$), a silicon oxide ($SiO_x$), an aluminum oxide ($AlO_x$), a photo resist, and various suitable types of organic/inorganic insulation materials.

The first and second end portions EP1 and EP2 of the light emitting elements LD that are not covered by (e.g., that are exposed by) the second insulation layer INS2 may be covered by respective contact electrodes CNE.

In an embodiment, the contact electrodes CNE may be sequentially formed on different layers on one surface of the substrate SUB as shown in FIGS. 6 and 7. For example, the third insulation layer INS3 may be disposed between the contact electrodes CNE formed as different conductive layers.

To allow the first end portion EP1 (e.g., the first semiconductor layer 11) of the light emitting elements LD, which exhibits a relatively large light emission amount, to not be overlapped by (e.g., to be covered by) the third insulation layer INS3, the second, fourth, sixth, and eighth contact electrodes CNE2, CNE4, CNE6, and CNE8 may be first formed on the second end portion EP2 of the light-emitting elements LD. In an embodiment, the second, fourth, sixth, and eighth contact electrodes CNE2, CNE4, CNE6, and CNE8 may be disposed on the same layer. For example, the second, fourth, sixth, and eighth contact electrodes CNE2, CNE4, CNE6, and CNE8 may be concurrently (or simultaneously) formed by the same process.

The third insulation layer INS3 may be disposed on the second, fourth, sixth, and eighth contact electrodes CNE2, CNE4, CNE6, and CNE8. In such an embodiment, the third insulation layer INS3 overlaps the second end portion EP2 of the light emitting elements LD in the third direction DR3, and it may be disposed to not overlap the first end portion EP1 of the light emitting elements LD in the third direction DR3. Accordingly, as described above, light emission efficiency deteriorated due to the third insulation layer INS3 may be reduced or minimized.

The first, third, fifth, and seventh contact electrodes CNE1, CNE3, CNE5, and CNE7 may be disposed on the third insulation layer INS3. The first, third, fifth, and seventh contact electrodes CNE1, CNE3, CNE5, and CNE7 may be disposed on the first end portion EP1 of the light emitting elements LD exposed by the third insulation layer INS3. In the embodiment, the first, third, fifth, and seventh contact electrodes CNE1, CNE3, CNE5, and CNE7 may be disposed on the same layer. For example, the first, third, fifth, and seventh contact electrodes CNE1, CNE3, CNE5, and CNE7 may be concurrently (or simultaneously) formed by the same process.

In an embodiment, the light emitting elements LD may be connected in series between the first and second pixel electrodes ELT1 and ELT2 by the contact electrodes CNE.

The first contact electrode CNE1 may contact the first end portion EP1 of the first light emitting element LD1 of the first serial stage and may contact the first pixel electrode ELT1 through an opening penetrating through the first insulation layer INS1.

The second contact electrode CNE2 may contact the second end portion EP2 of the first light emitting element LD1 of the first serial stage.

The third contact electrode CNE3 may contact the first end portion EP1 of the second light emitting element LD2 of the second serial stage and may contact the second contact electrode CNE2 through an opening penetrating through the third insulation layer INS3.

The fourth contact electrode CNE4 may contact the second end portion EP2 of the second light emitting element LD2 of the second serial stage.

The fifth contact electrode CNE5 may contact the first end portion EP1 of the third light emitting element LD3 of the third serial stage and may contact the fourth contact electrode CNE4 through an opening penetrating through the third insulation layer INS3.

The sixth contact electrode CNE6 may contact the second end portion EP2 of the third light emitting element LD3 of the third serial stage.

The seventh contact electrode CNE7 may contact the first end portion EP1 of the fourth light emitting element LD4 of the fourth serial stage and may contact the sixth contact electrode CNE6 penetrating through an opening through the third insulation layer INS3.

The eighth contact electrode CNE8 may contact the second end portion EP2 of the fourth light emitting element LD4 of the fourth serial stage and may contact the second pixel electrode ELT2 through an opening through the first insulation layer INS1. Accordingly, the first to fourth light emitting elements LD1 to LD4 may be sequentially connected in series.

The contact electrodes CNE may include (or may be made of) various transparent conductive materials. For example, the contact electrodes CNE may include at least one of various transparent materials, such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to achieve a reference transmittance (e.g., to satisfy a predetermined transmittance). Accordingly, the light emitted from the first and second end portions EP1 and EP2 of the light emitting elements EP1 and LD2 may transmit through the contact electrodes CNE to be emitted to the outside of the display panel PNL.

The third insulation layer INS3 may be a single layer or may have a multilayer structure and may include at least one inorganic insulation material and/or organic insulation material. For example, the third insulation layer INS3 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

A fourth insulation layer INS4 may be disposed on the contact electrodes CNE and the third insulation layer INS3. For example, the fourth insulation layer INS4 may cover the bank BNK, the pixel electrodes ELT, the light emitting elements LD, the contact electrodes CNE, and the lower insulation layers INS1, INS2, and INS3. The fourth insulation layer INS4 may include at least one layer of an inorganic layer and/or organic layer.

The fourth insulation layer INS4 may be a single layer or may have a multilayer structure and may include at least one inorganic insulation material and/or organic insulation material. For example, the fourth insulation layer INS4 may include a silicon nitride ($SiN_x$), a silicon oxide ($SiO_x$), a silicon oxynitride ($SiO_xN_y$), or an aluminum oxide ($AlO_x$), and various suitable types of organic/inorganic insulation materials.

In an embodiment, the fourth insulation layer INS4 may include a thin film encapsulation layer of a multi-layered structure. For example, the fourth insulation layer INS4 may include a thin film encapsulation layer of a multi-layered structure that includes at least two inorganic insulation layers and at least one organic insulation layer interposed between the at least two inorganic insulation layers. However, the present disclosure is not necessarily limited thereto, and the material and/or structure of the fourth insulation layer INS4 may be variously, suitably changed.

According to the display device of the embodiment described above, the light emitting elements LD are connected in series by using the contact electrodes CNE, and in this embodiment, the third insulation layer INS3 disposed between the contact electrodes CNE does not overlap the first end portion EP1 (e.g., the first semiconductor layer 11) of the light emitting elements LD, which exhibits a relatively large light emission amount, so that it is possible to improve the light emission efficiency of the display panel PNL.

Hereinafter, another embodiment will be described. The same elements as those described above will be referred to with the same reference numerals in embodiments below, and redundant descriptions thereof may be omitted or simplified.

Figure 8:
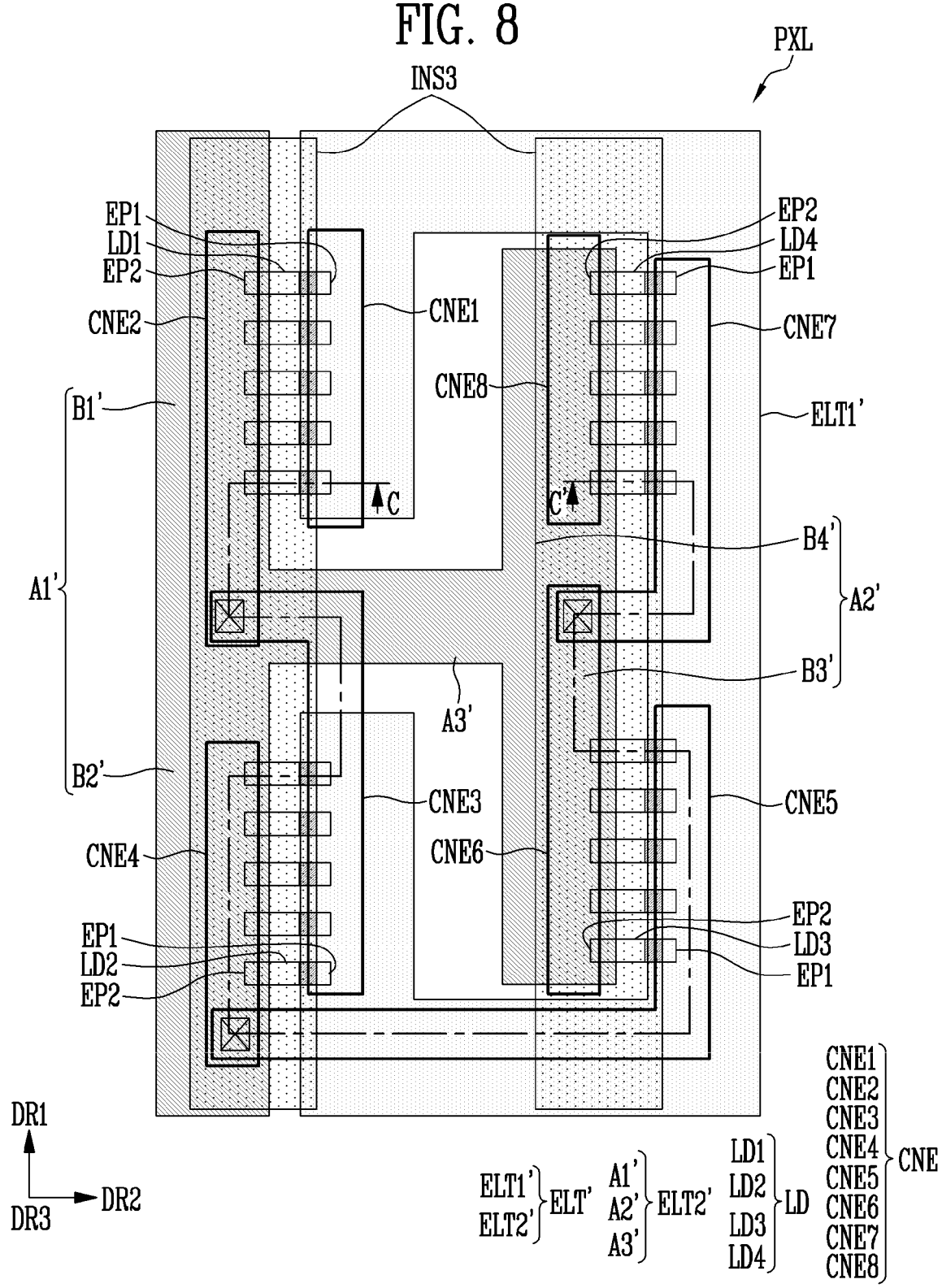
FIG. 8 illustrates a top plan view of a display device according to another embodiment.
Figure 9:
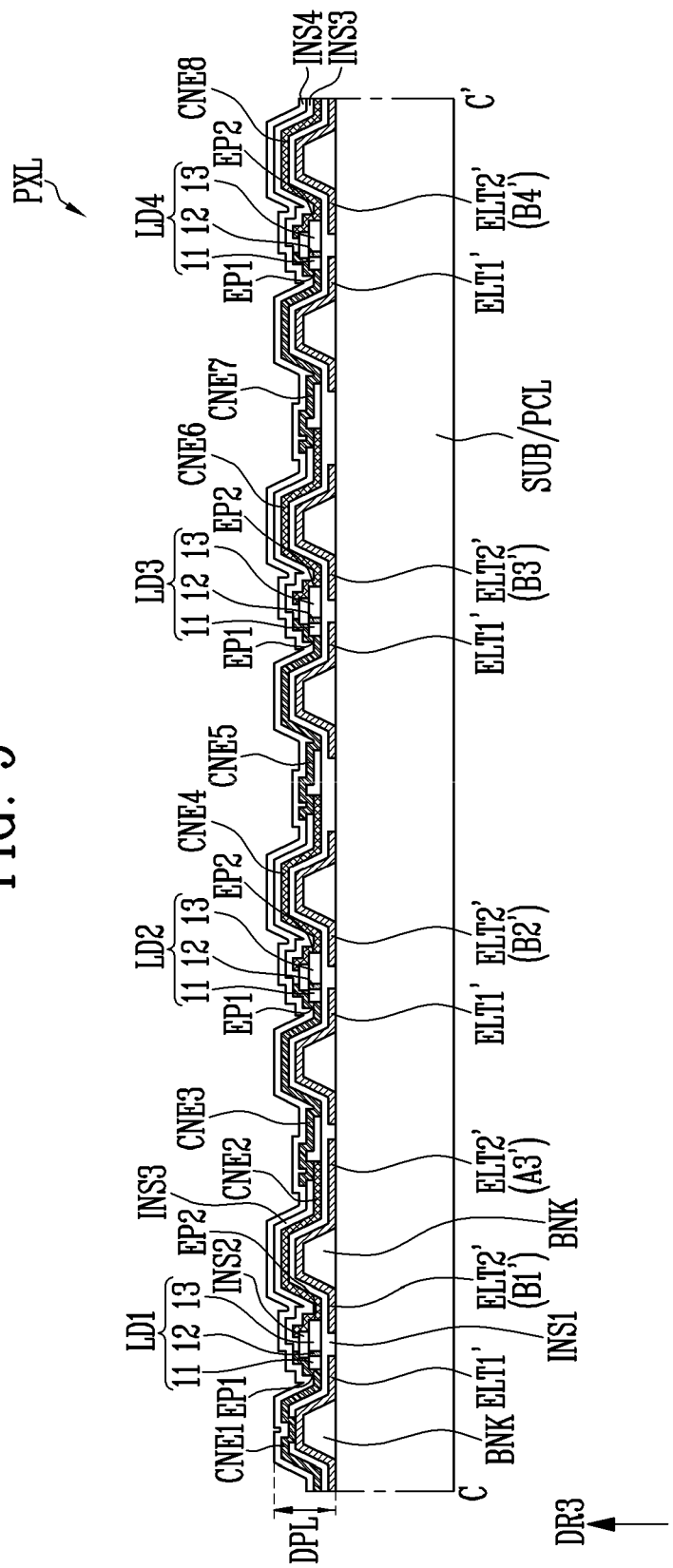
FIG. 9 illustrates a cross-sectional view taken along the line C-C' of FIG. 8.

FIG. 8 illustrates a top plan view of a display device according to another embodiment, and FIG. 9 illustrates a cross-sectional view taken along the line C-C' of FIG. 8.

Referring to FIGS. 8 and 9, the display device according to the present embodiment is different from that shown in FIGS. 1 to 7 in that a second pixel electrode ELT2' has a branch area and the first pixel electrode ELT1' surrounds at least a portion of (e.g., extends around a periphery of at least a portion of) the second pixel electrode ELT2'.

For example, the second pixel electrode ELT2' may include a first area A1', a second area A2', and a third area A3' disposed between the first area A1' and the second area A2'. The first area A1' and the second area A2' of the second pixel electrode ELT2' may extend in the first direction DR1 and may be spaced apart from each other by an interval in the second direction DR2 crossing the first direction DR1. The third area A3' of the second pixel electrode ELT2' may extend in the second direction DR2 between the first and second areas A1' and A2'.

Each of the first and second areas A1' and A2' of the second pixel electrode ELT2' may include a plurality of branch areas B1', B2', B3', and B4' branched from one end and the other end of the third area A3'. For example, the first area A1' of the second pixel electrode ELT2' may include the first branch area B1' extending from one end of the third area A3' in the first direction DR1 and the second branch area B2' extending in a direction opposite to the first direction DR1 from one end of the third area A3'. In addition, the second area A2' of the second pixel electrode ELT2' may include the third branch area B3' extending from the other end of the third area A3' in a direction opposite to the first direction DR1, and the fourth branch area B4' extending from the other end of the third area A3' in the first direction DR1.

The first pixel electrode ELT1' may be spaced apart from the second pixel electrode ELT2' and may be disposed to surround (e.g., to extend around a periphery of) at least a portion of the second pixel electrode ELT2'. For example, the first pixel electrode ELT1' may be disposed to surround the second area A2' of the second pixel electrode ELT2'. In such an embodiment, one end of the first pixel electrode ELT1' may face the first branch area B1' of the second pixel electrode ELT2', and the other end of the first pixel electrode ELT1' may face the second branch area B2' of the second pixel electrode ELT2'. However, it is not necessarily limited thereto, and the shape and/or mutual disposition structure of each of the first and second pixel electrodes ELT1' and ELT2' may be variously changed according to embodiments.

The light emitting elements LD may be disposed between the first and second pixel electrodes ELT1' and ELT2'. In such an embodiment, the light emitting elements LD may be directionally aligned between the first and second pixel electrodes ELT1' and ELT2'. For example, the light emitting elements LD may be disposed so that the first end portion EP1 faces the first pixel electrode ELT1' and the second end portion EP2 faces the second pixel electrode ELT2'.

In an embodiment, the first and second light emitting elements LD1 and LD2 may be disposed between the first area A1' of the second pixel electrode ELT2' and the first pixel electrode ELT1'. The third and fourth light emitting elements LD3 and LD4 may be disposed between the second area A2' of the second pixel electrode ELT2' and the first pixel electrode ELT1'.

For example, the first light emitting element LD1 may be disposed between the first branch area B1' of the second pixel electrode ELT2' and the first pixel electrode ELT1'. The second light emitting element LD2 may be disposed between the second branch area B2' of the second pixel electrode ELT2' and the first pixel electrode ELT1'. The third light emitting element LD3 may be disposed between the third branch area B3' of the second pixel electrode ELT2' and the first pixel electrode ELT1'. The fourth light emitting element LD4 may be disposed between the first branch area B1' of the second pixel electrode ELT2' and the first pixel electrode ELT1'.

The light emitting elements LD may be electrically connected to the first and second pixel electrodes ELT1' and ELT2' through the contact electrode CNE.

The first contact electrode CNE1 may be disposed on the first pixel electrode ELT1' and the first end portion EP1 of the first light emitting element LD1. The first contact electrode CNE1 may overlap the first pixel electrode ELT1' and/or the first end portion EP1 of the first light emitting element LD1 in the third direction DR3. The first contact electrode CNE1 may contact the first pixel electrode ELT1' and the first end portion EP1 of the first light emitting element LD1. For example, the first contact electrode CNE1 may electrically connect the first pixel electrode ELT1' and the first light emitting element LD1.

The second contact electrode CNE2 may be disposed on the second end portion EP2 of the first light emitting element LD1. The second contact electrode CNE2 may overlap the second end portion EP2 of the first light emitting element LD1 in the third direction DR3. In addition, the second contact electrode CNE2 may overlap the first branch area B1' of the second pixel electrode ELT2' in the third direction DR3. The second contact electrode CNE2 may contact the second end portion EP2 of the first light emitting element LD1.

The third contact electrode CNE3 may be disposed on the first end portion EP1 of the second light emitting element LD2. The third contact electrode CNE3 may overlap the first end portion EP1 of the second light emitting element LD2 in the third direction DR3. In addition, the third contact electrode CNE3 may overlap the first pixel electrode ELT1' in the third direction DR3. The third contact electrode CNE3 may contact the second contact electrode CNE2 and the first end portion EP1 of the second light emitting element LD2. That is, the third contact electrode CNE3 may electrically connect the second contact electrode CNE2 and the second light emitting element LD2. For example, the third contact electrode CNE3 may be disposed on a different layer from the second contact electrode CNE2 and may contact the second contact electrode CNE2 through a separate contact opening. Accordingly, the second end portion EP2 of the first light emitting element LD1 may be connected to the first end portion EP1 of the second light emitting element LD2 through the second and third contact electrodes CNE2 and CNE3.

The fourth contact electrode CNE4 may be disposed on the second end portion EP2 of the second light emitting element LD2. The fourth contact electrode CNE4 may overlap the second end portion EP2 of the second light emitting element LD2 in the third direction DR3. In addition, the fourth contact electrode CNE4 may overlap the second branch area B2' of the second pixel electrode ELT2' in the third direction DR3. The fourth contact electrode CNE4 may contact the second end portion EP2 of the second light emitting element LD2.

The fifth contact electrode CNE5 may be disposed on the first end portion EP1 of the third light emitting element LD3. The fifth contact electrode CNE5 may overlap the first end portion EP1 of the third light emitting element LD3 in the third direction DR3. In addition, the fifth contact electrode CNE5 may overlap the first pixel electrode ELT1' in the third direction DR3. The fifth contact electrode CNE5 may contact the fourth contact electrode CNE4 and the first end portion EP1 of the third light emitting element LD3. For example, the fifth contact electrode CNE5 may electrically connect the fourth contact electrode CNE4 and the third light emitting element LD3. For example, the fifth contact electrode CNE5 may be disposed on a different layer from the fourth contact electrode CNE4 and may contact the fourth contact electrode CNE4 through a separate contact opening. Accordingly, the second end portion EP2 of the second light emitting element LD2 may be connected to the first end portion EP1 of the third light emitting element LD3 through the fourth and fifth contact electrodes CNE4 and CNE5.

The sixth contact electrode CNE6 may be disposed on the second end portion EP2 of the third light emitting element LD3. The sixth contact electrode CNE6 may overlap the second end portion EP2 of the third light emitting element LD3 in the third direction DR3. In addition, the sixth contact electrode CNE6 may overlap the third branch area B3' of the second pixel electrode ELT2' in the third direction DR3. The sixth contact electrode CNE6 may contact the second end portion EP2 of the third light emitting element LD3.

The seventh contact electrode CNE7 may be disposed on the first end portion EP1 of the fourth light emitting element LD4. The seventh contact electrode CNE7 may overlap the first end portion EP1 of the fourth light emitting element LD4 in the third direction DR3. In addition, the seventh contact electrode CNE5 may overlap the first pixel electrode ELT1' in the third direction DR3. The seventh contact electrode CNE7 may contact the sixth contact electrode CNE6 and the first end portion EP1 of the fourth light emitting element LD4. For example, the seventh contact electrode CNE7 may electrically connect the sixth contact electrode CNE6 and the fourth light emitting element LD4. For example, the seventh contact electrode CNE7 may be disposed on a different layer from the sixth contact electrode CNE6 and may contact the sixth contact electrode CNE6 through a separate contact opening. Accordingly, the second end portion EP2 of the third light emitting element LD3 may be connected to the first end portion EP1 of the fourth light emitting element LD4 through the sixth and seventh contact electrodes CNE6 and CNE7.

The eighth contact electrode CNE8 may be disposed on the second pixel electrode ELT2' and the second end portion EP2 of the fourth light emitting element LD4. The eighth contact electrode CNE8 may overlap the second branch area B4' of the second pixel electrode ELT2' and/or the second end portion EP2 of the fourth light emitting element LD4 in third direction DR3. The eighth contact electrode CNE8 may contact the second pixel electrode ELT2' and the second end portion EP2 of the fourth light emitting element LD4. For example, the eighth contact electrode CNE8 may electrically connect the second pixel electrode ELT2' and the fourth light emitting element LD4.

To ensure that the first end portion EP1 (e.g., the first semiconductor layer 11) of the light emitting elements LD, which has a relatively large light emission amount, to not be overlapped by (e.g., to not be covered by) the third insulation layer INS3, the second, fourth, sixth, and eighth contact electrodes CNE2, CNE4, CNE6, and CNE8 may be first formed on the second end portion EP2 of the light-emitting elements LD. In an embodiment, the second, fourth, sixth, and eighth contact electrodes CNE2, CNE4, CNE6, and CNE8 may be disposed on the same layer. The second, fourth, sixth, and eighth contact electrodes CNE2, CNE4, CNE6, and CNE8 may be concurrently (or simultaneously) formed in the same process but are not limited thereto.

The third insulation layer INS3 may be disposed on the second, fourth, sixth, and eighth contact electrodes CNE2, CNE4, CNE6, and CNE8. In such an embodiment, the third insulation layer INS3 overlaps the second end portion EP2 of the light emitting elements LD in the third direction DR3, and it may be disposed to not overlap (e.g., to expose) the first end portion EP1 of the light emitting elements LD in the third direction DR3.

The first, third, fifth, and seventh contact electrodes CNE1, CNE3, CNE5, and CNE7 may be disposed on the third insulation layer INS3. The first, third, fifth, and seventh contact electrodes CNE1, CNE3, CNE5, and CNE7 may be disposed on the first end portion EP1 of the light emitting elements LD exposed by the third insulation layer INS3. In an embodiment, the first, third, fifth, and seventh contact electrodes CNE1, CNE3, CNE5, and CNE7 may be disposed on the same layer. The first, third, fifth, and seventh contact electrodes CNE1, CNE3, CNE5, and CNE7 may be concurrently (or simultaneously) formed in the same process but are not necessarily limited thereto.

In an embodiment, the light emitting elements LD may be connected in series by the contact electrodes CNE. For example, the first contact electrode CNE1 may contact the first end portion EP1 of the first light emitting element LD1 of the first serial stage. The second contact electrode CNE2 may contact the second end portion EP2 of the first light emitting element LD1 of the first serial stage. The third contact electrode CNE3 may contact the first end portion EP1 of the second light emitting element LD2 of the second serial stage and may contact the second contact electrode CNE2 through an opening penetrating through the third insulation layer INS3. The fourth contact electrode CNE4 may contact the second end portion EP2 of the second light emitting element LD2 of the second serial stage. The fifth contact electrode CNE5 may contact the first end portion EP1 of the third light emitting element LD3 of the third serial stage and may contact the fourth contact electrode CNE4 through an opening penetrating through the third insulation layer INS3. The sixth contact electrode CNE6 may contact the second end portion EP2 of the third light emitting element LD3 of the third serial stage. The seventh contact electrode CNE7 may contact the first end portion EP1 of the fourth light emitting element LD4 of the fourth serial stage and may contact the sixth contact electrode CNE6 penetrating through an opening through the third insulation layer INS3. The eighth contact electrode CNE8 may contact the second end portion EP2 of the fourth light emitting element LD4 of the fourth serial stage. Accordingly, the first to fourth light emitting elements LD1 to LD4 may be sequentially connected in series.

According to the display device of the present embodiment, the light emitting elements LD are connected in series by using the contact electrodes CNE, and in this embodiment, the third insulation layer INS3 disposed between the contact electrodes CNE may be disposed to not overlap the first end portion EP1 (e.g., the first semiconductor layer 11) of the light emitting elements LD, which has a relatively large light emission amount. Accordingly, as described above, the light emission efficiency may not be deteriorated (or substantially deteriorated) due to the third insulation layer INS3.

A manufacturing method of the display device according to the above-described embodiment will now be described.

FIGS. 10 to 15 illustrate cross-sectional views of steps of a manufacturing method of a display device according to an embodiment. FIGS. 10 to 15 are top plan views for explaining a manufacturing method of the display device shown in FIG. 5. Constituent elements that are substantially the same as those described with respect to FIG. 5 are denoted by the same reference numerals, and detailed descriptions thereof may be omitted. In FIGS. 10 to 15, the forming of the circuit layer PCL on the substrate SUB is omitted for better understanding and ease of description, and the forming of the pixel electrodes ELT, the light emitting elements LD, the contact electrodes CNE, and the third insulation layer INS3 of the display layer DPL on the circuit layer PCL is primarily illustrated.

Figure 10:
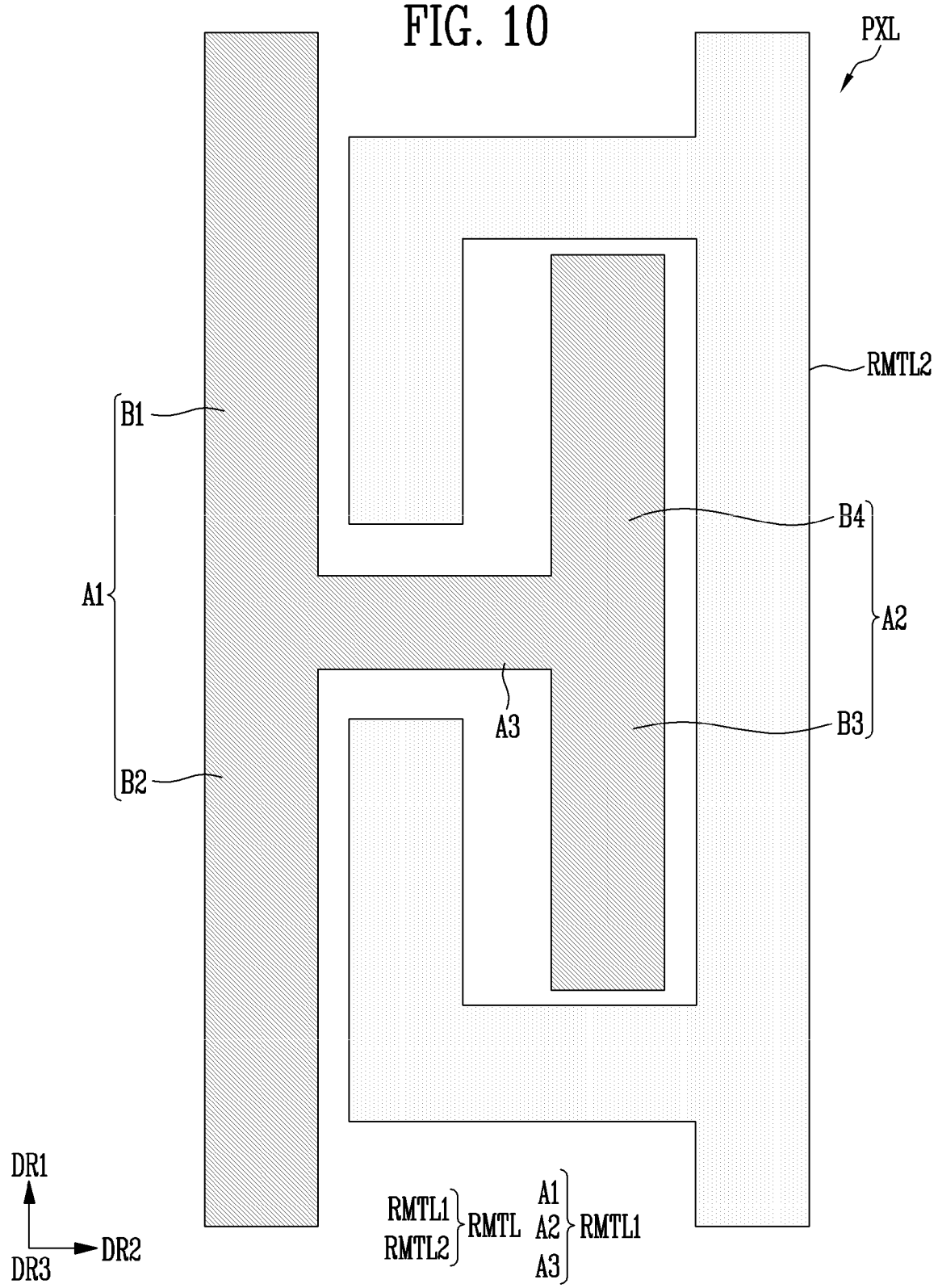
FIGS. 10 to 15 illustrate cross-sectional views of steps of a manufacturing method of a display device according to an embodiment.

Referring to FIG. 10, the first and second alignment electrodes RMTL1 and RMTL2, spaced apart from each other, are formed. The first and second alignment electrodes RMTL1 and RMTL2 may be entirely and commonly connected to the plurality of pixels PXL.

The first alignment electrode RMTL1 may include the first area A1, the second area A2, and the third area A3 disposed between the first area A1 and the second area A2. The first area A1 and the second area A2 of the first alignment electrode RMTL1 may extend in a first direction DR1 and may be spaced apart from each other by an interval in a second direction DR2 crossing the first direction DR1. The third area A3 of the first alignment electrode RMTL1 may extend in the second direction DR2 between the first and second areas A1 and A2.

The first and second areas A1 and A2 of the first alignment electrode RMTL1 may each include the branch areas B1, B2, B3, and B4 branched from one end and the other end of the third area A3. For example, the first area A1 of the first alignment electrode RMTL1 may include the first branch area B1 extending from one end of the third area A3 in the first direction DR1 and the second branch area B2 extending from one end of the third area A3 in an opposite direction of the first direction DR1. In addition, the second area A2 of the first alignment electrode RMTL1 may include the third branch area B3 extending from the other end of the third area A3 in an opposite direction of the first direction DR1 and the fourth branch area B4 extending from the other end of the third area A3 in the first direction DR1.

The second alignment electrode RMTL2 may be spaced apart from the first alignment electrode RMTL1 and may be disposed to surround (e.g., to extend around a periphery of) at least a portion of the first alignment electrode RMTL1. For example, the second alignment electrode RMTL2 may be disposed to surround the second area A2 of the first alignment electrode RMTL1. However, it is not necessarily limited thereto, and the shape and/or mutual disposition structure of each of the first and second alignment electrodes RMTL1 and RMTL2 may be variously changed according to embodiments.

FIG. 10 illustrates an embodiment in which the first and second alignment electrodes RMTL1 and RMTL2 are integrally formed entirely on the plurality of pixels PXL, but the present disclosure is not necessarily limited thereto. For example, the first and second alignment electrodes RMTL1 and RMTL2 may be formed in a separate pattern for each pixel PXL, and the alignment electrodes of each pixel PXL may be electrically connected to each other by at least one contact opening and/or bridge pattern.

Figure 11:
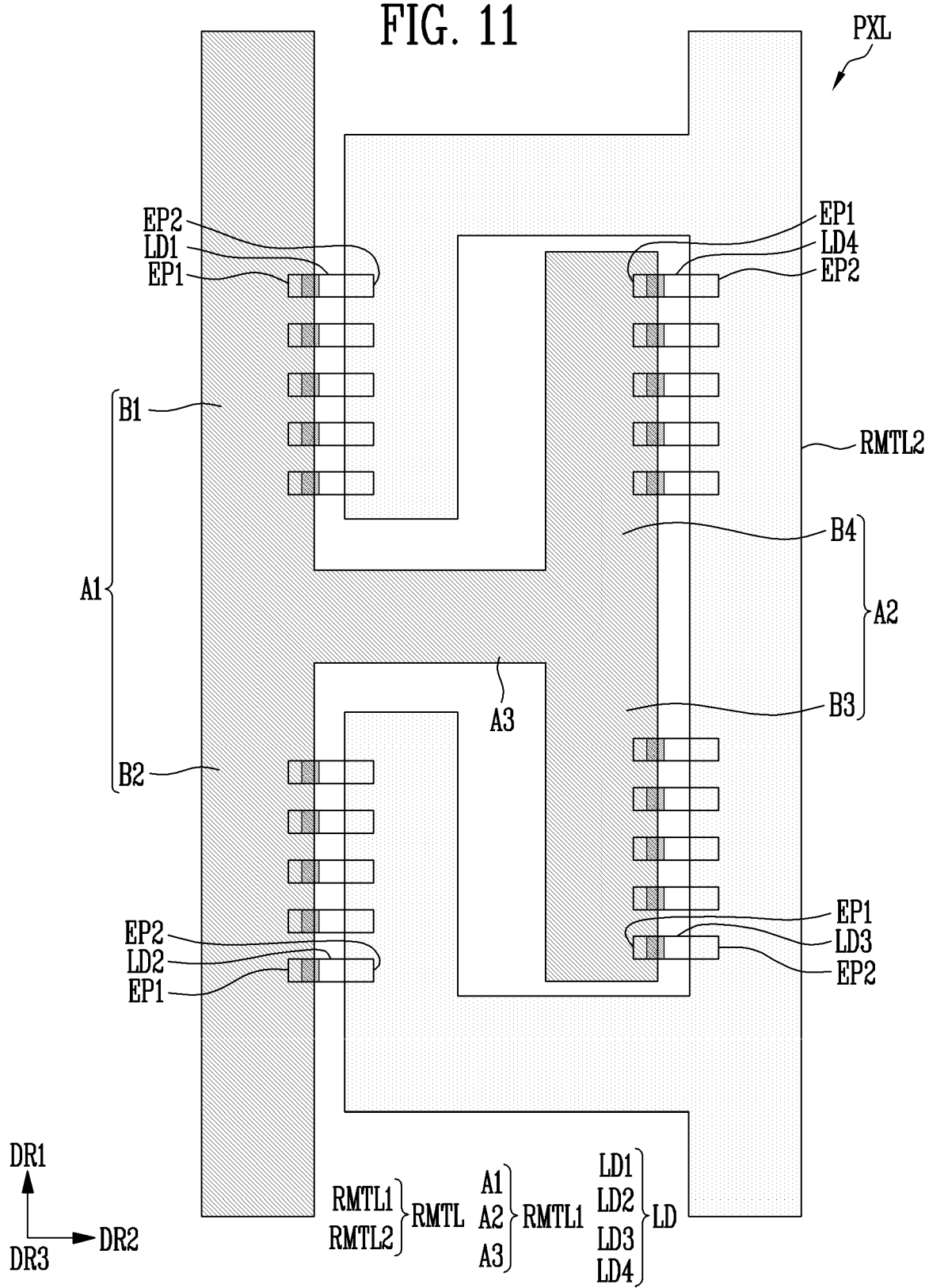

Next, referring to FIG. 11, the light emitting elements LD are supplied and aligned between the first and second alignment electrodes RMTL1 and RMTL2. For example, the first and second alignment electrodes RMTL1 and RMTL2 may receive a first alignment signal (e.g., first alignment voltage) and a second alignment signal (e.g., second alignment voltage), respectively, in the alignment step of the light emitting elements LD. For example, one of the first and second alignment electrodes RMTL1 and RMTL2 may be supplied with an AC-type alignment signal, and the other of the first and second alignment electrodes RMTL1 and RMTL2 may be supplied with an alignment voltage (e.g., a ground voltage) having a constant voltage level. For example, an alignment signal (e.g., a predetermined alignment signal) may be applied to the first and second alignment electrodes RMTL1 and RMLT2 in the alignment step of the light emitting elements LD.

The light emitting elements LD may be supplied to each pixel PXL through an inkjet method, a slit coating method, or other various suitable methods, and they may be aligned between the first and second alignment electrodes RMTL1 and RMTL2 with directionality by the alignment signal (e.g., the alignment voltage) applied to each of the first and second alignment electrodes RMTL1 and RMTL2. For example, the light emitting elements LD may be disposed (e.g., aligned) between first and second alignment electrodes RMTL1 and RMTL2 such that the first end portion EP1 faces the first alignment electrode RMTL1 and the second end portion EP2 faces the second alignment electrode RMTL2.

In an embodiment, the first and second light emitting elements LD1 and LD2 may be aligned between the first area A1 of the first alignment electrode RMTL1 and the second alignment electrode RMTL2. The third and fourth light emitting elements LD3 and LD4 may be aligned between the second area A2 of the first alignment electrode RMTL1 and the second alignment electrode RMTL2.

For example, the first light emitting element LD1 may be aligned between the first branch area B1 of the first alignment electrode RMTL1 and the second alignment electrode RMTL2. The second light emitting element LD2 may be aligned between the second branch area B2 of the first alignment electrode RMTL1 and the second alignment electrode RMTL2. The third light emitting element LD3 may be aligned between the third branch area B3 of the first alignment electrode RMTL1 and the second alignment electrode RMTL2. The fourth light emitting element LD4 may be aligned between the fourth branch area B4 of the first alignment electrode RMTL1 and the second alignment electrode RMTL2.

Figure 12:
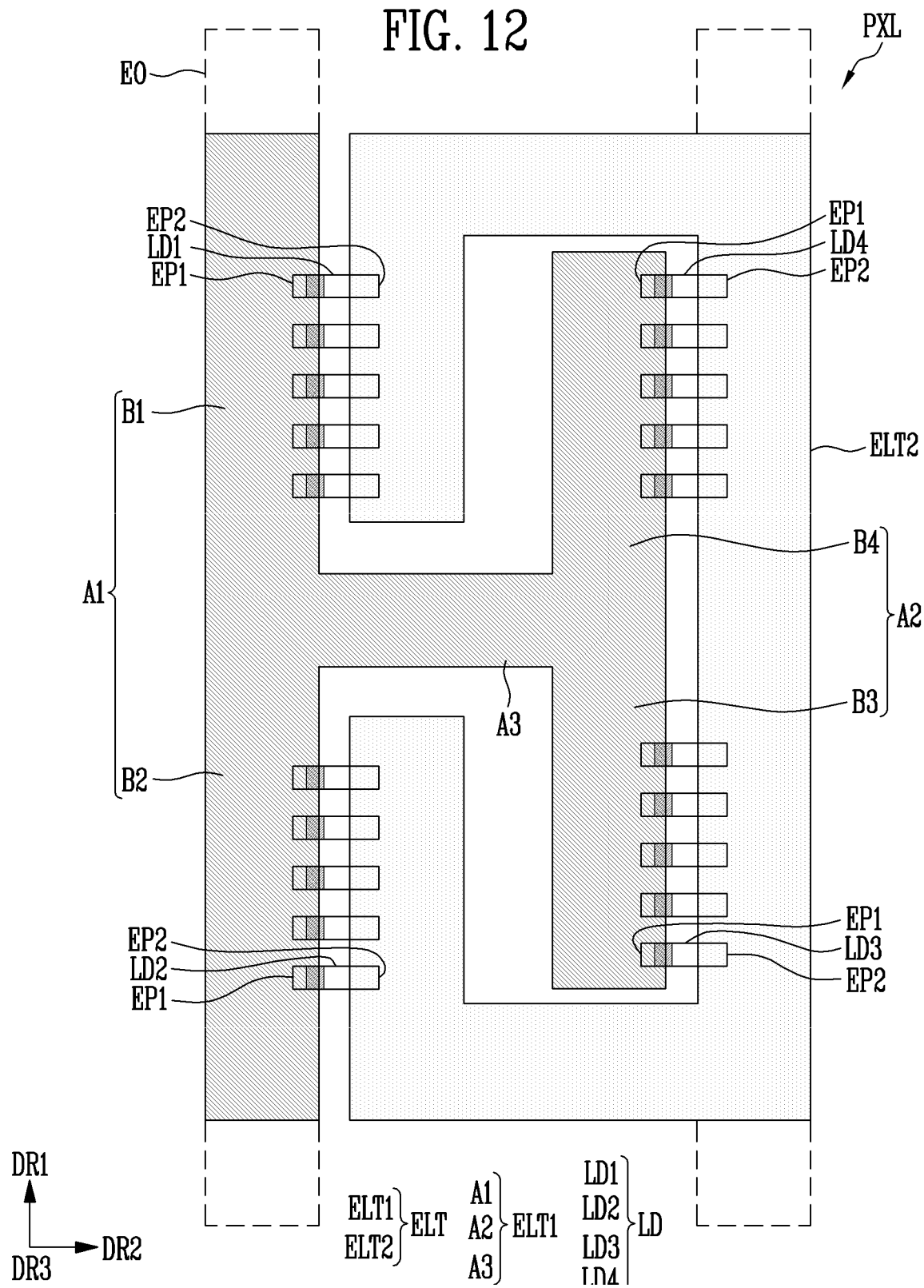

Subsequently, referring to FIG. 12, the first and second alignment electrodes RMTL1 and RMTL2 of respective pixels PXL are separated in a separation area EO to form the first and second pixel electrodes ELT1 and ELT2 of respective pixels PXL. As an example, the separation area EO is a non-light emitting area and may correspond to a boundary of the pixels PXL. After the light emitting elements LD are aligned, because the first and second alignment electrodes RMTL1 and RMTL2 are separated in the separation area EO to form the first and second pixel electrodes ELT1 and ELT2, the pixels PXL that may be individually driven may be formed.

Figure 13:
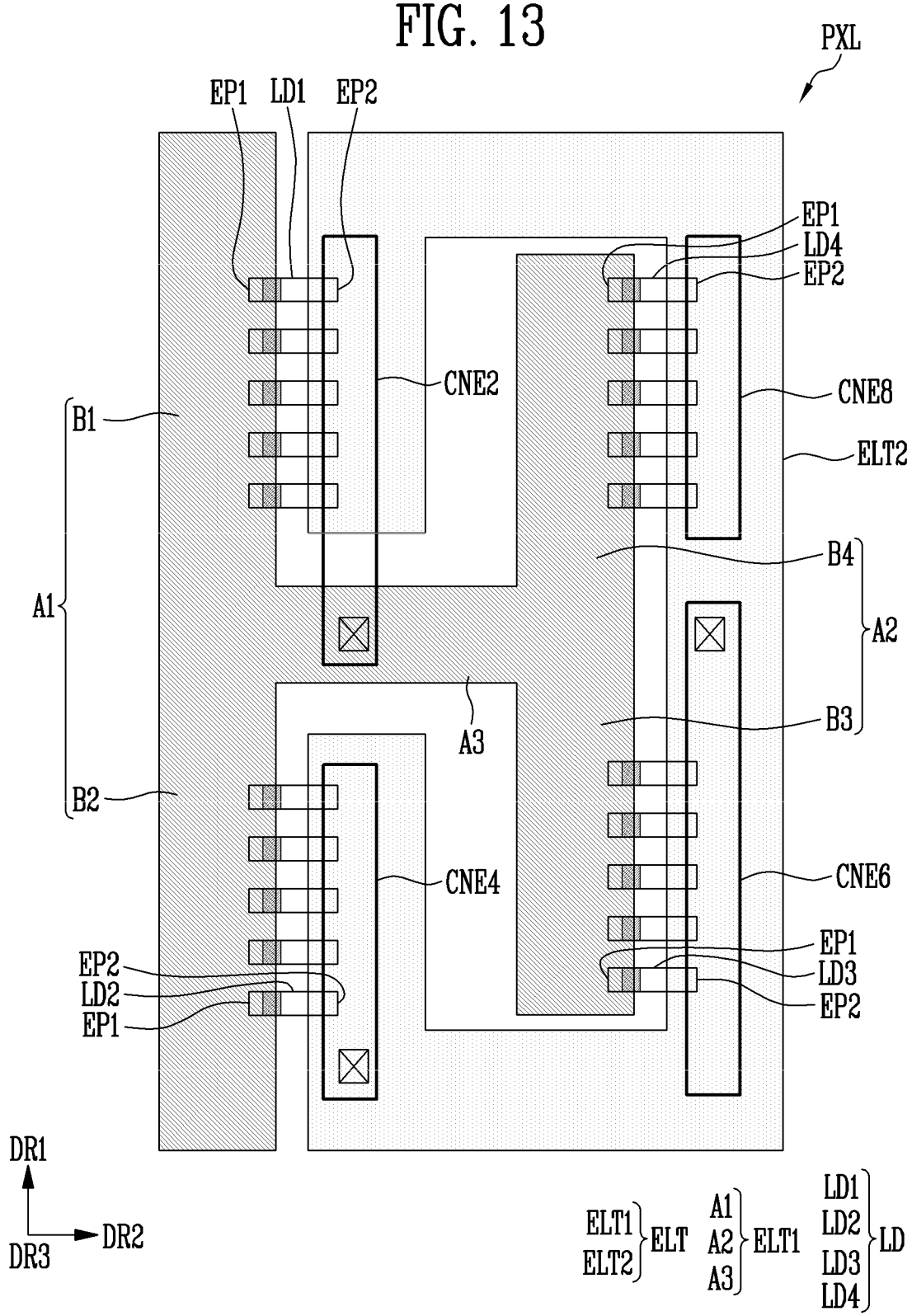

Subsequently, referring to FIG. 13, the second, fourth, sixth, and eighth contact electrodes CNE2, CNE4, CNE6, and CNE8 are formed on the second end portion EP2 of the light emitting elements LD of each serial stage, respectively. The second, fourth, sixth, and eighth contact electrodes CNE2, CNE4, CNE6, and CNE8 may be disposed on the same layer. The second, fourth, sixth, and eighth contact electrodes CNE2, CNE4, CNE6, and CNE8 may be concurrently (or simultaneously) formed in the same process but are not necessarily limited thereto.

The second contact electrode CNE2 may be directly formed on the second end portion EP2 of the first light emitting element LD1 to contact the second end portion EP2 of the first light emitting element LD1. The fourth contact electrode CNE4 may be directly formed on the second end portion EP2 of the second light emitting element LD2 to contact the second end portion EP2 of the second light emitting element LD2. The sixth contact electrode CNE6 may be directly formed on the second end portion EP2 of the third light emitting element LD3 to contact the second end portion EP2 of the third light emitting element LD3. The eighth contact electrode CNE8 may be directly formed on the second end portion EP2 of the fourth light emitting element LD4 to contact the second end portion EP2 of the fourth light emitting element LD4.

Figure 14:
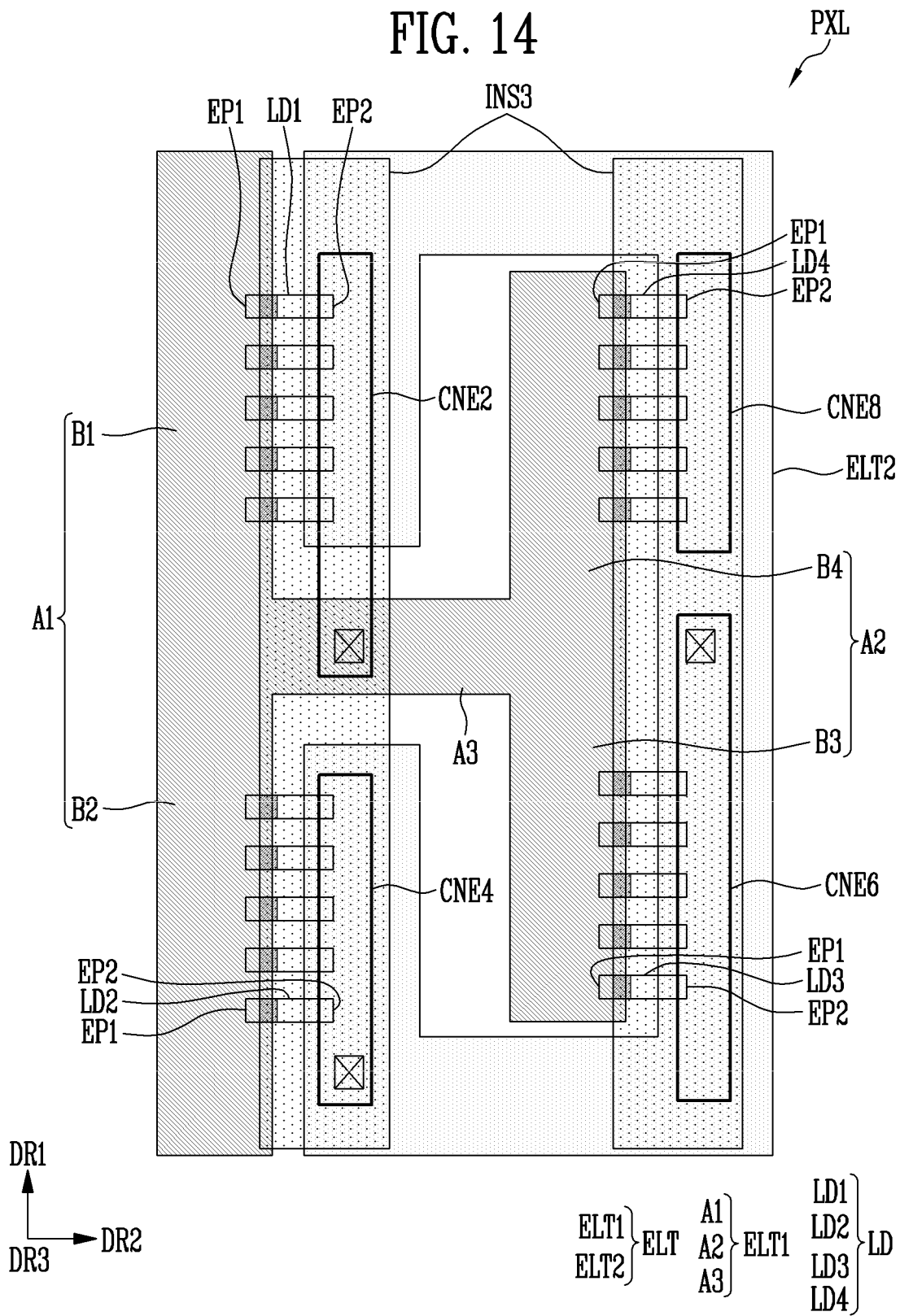
Figure 15:
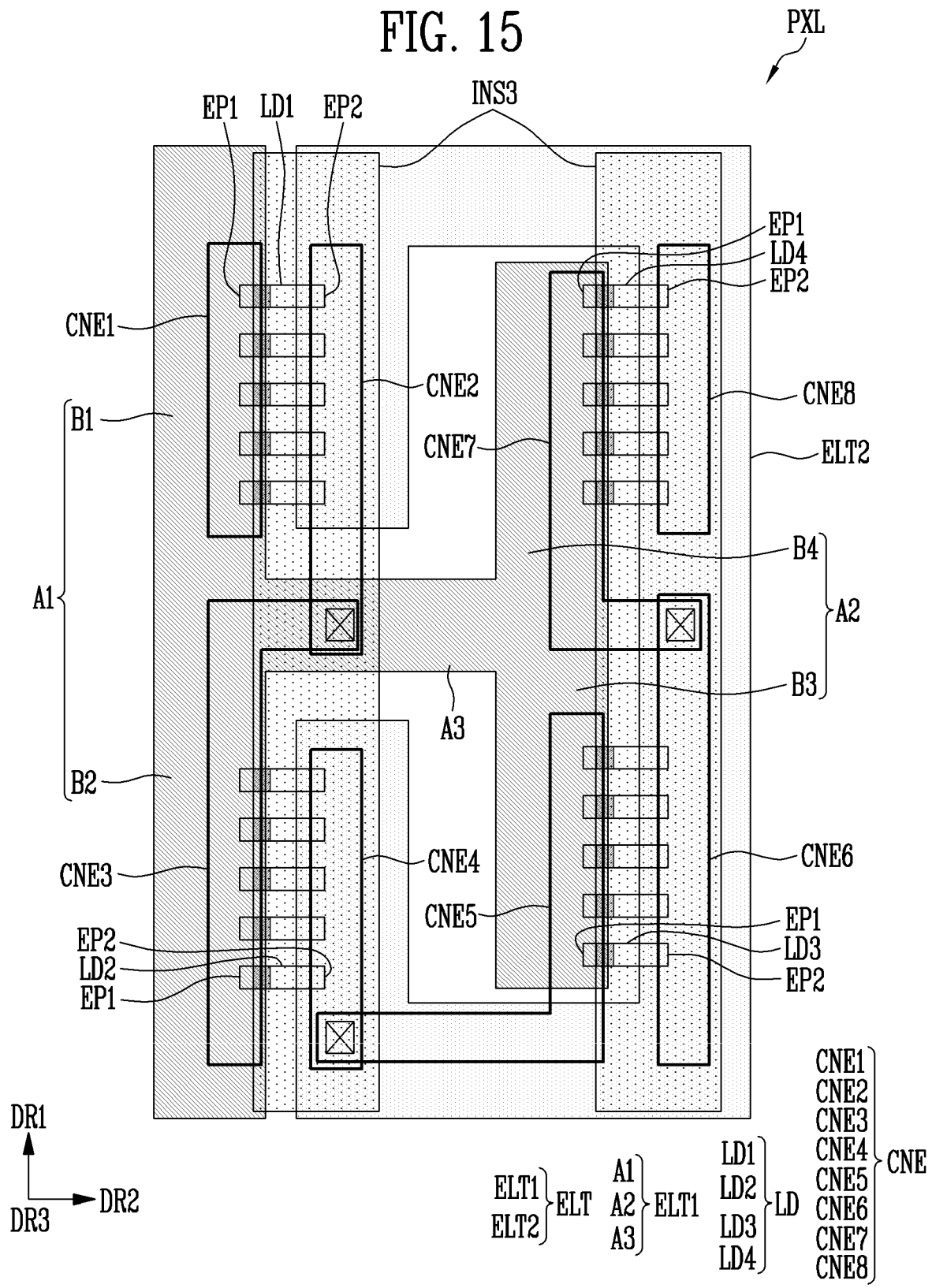

Subsequently, referring to FIG. 14, the third insulation layer INS3 is formed on the second, fourth, sixth, and eighth contact electrodes CNE2, CNE4, CNE6, and CNE8. The third insulation layer INS3 overlaps the second end portion EP2 of the light emitting elements LD in the third direction DR3, and it may be disposed to not overlap the first end portion EP1 of the light emitting elements LD in the third direction DR3. Accordingly, as described above, the light emission efficiency may not be deteriorated (or substantially deteriorated) due to the third insulation layer INS3.

Subsequently, Referring to RIG. 15, the display device shown in FIG. 5 may be completed by forming the first, third, fifth, and seventh contact electrodes CNE1, CNE3, CNE5, and CNE7 on the first end portion EP1 of the light emitting elements LD of each serial stage.

The first, third, fifth, and seventh contact electrodes CNE1, CNE3, CNE5, and CNE7 may be disposed on the same layer. For example, the first, third, fifth, and seventh contact electrodes CNE1, CNE3, CNE5, and CNE7 may be concurrently (or simultaneously) formed in the same process but are not necessarily limited thereto.

The first contact electrode CNE1 may contact the first end portion EP1 of the first light emitting element LD1. The third contact electrode CNE3 may contact the first end portion EP1 of the second light emitting element LD2 and may contact the second contact electrode CNE2 through an opening penetrating through the third insulation layer INS3. The fifth contact electrode CNE5 may contact the first end portion EP1 of the third light emitting element LD3 and may contact the fourth contact electrode CNE4 through an opening penetrating through the third insulation layer INS3. The seventh contact electrode CNE7 may contact the first end portion EP1 of the fourth light emitting element LD4 and may contact the sixth contact electrode CNE6 penetrating through an opening through the third insulation layer INS3. The eighth contact electrode CNE8 may contact the second end portion EP2 of the fourth light emitting element LD4. Accordingly, the first to fourth light emitting elements LD1 to LD4 may be sequentially connected in series.

Those skilled in the art related to the present disclosure will readily appreciate that many modifications are possible to the described embodiments without materially departing from the teachings of this disclosure. That is, the embodiments described herein should be considered in a descriptive sense and not for purposes of limitation. The scope of the present disclosure is defined by the appended claims, and all differences within the equivalent scope will be construed as being included in the present disclosure.

What is claimed is:

1. A display device comprising:
   a first electrode and a second electrode spaced apart from each other;
   first and second light emitting elements between the first electrode and the second electrode;
   a first contact electrode contacting the first electrode and a first end portion of the first light emitting element;
   a second contact electrode contacting a second end portion of the first light emitting element;
   a third contact electrode contacting the second contact electrode and a first end portion of the second light emitting element and at least partially overlapping the first electrode and the second contact electrode; and
   a fourth contact electrode contacting a second end portion of the second light emitting element and overlapping the second electrode,
   wherein the first contact electrode and the third contact electrode are on the same layer.

2. The display device of claim 1, further comprising an insulation layer on the second contact electrode and the fourth contact electrode.

3. The display device of claim 2, wherein the insulation layer does not overlap the first end portions of the first and second light emitting elements.

4. The display device of claim 3, wherein each of the first and second light emitting elements comprises a p-type semiconductor layer at the first end portion.

5. The display device of claim 2, wherein the third contact electrode contacts the second contact electrode through a contact opening penetrating through the insulation layer.

6. The display device of claim 1, wherein the second contact electrode and the fourth contact electrode are on the same layer.

7. The display device of claim 1, wherein the first electrode has a first area, a second area, and a third area between the first area and the second area, and
   wherein the second electrode extends around a periphery of the second area of the first electrode.

8. The display device of claim 7, wherein the first area and the second area of the first electrode extend in a first direction, and
   wherein the third area of the first electrode extends in a second direction crossing the first direction.

9. The display device of claim 8, wherein the first and second light emitting elements are between the first area of the first electrode and the second electrode.

10. The display device of claim 9, wherein the first area has a first branch area extending from one end of the third area in the first direction and a second branch area extending from the one end of the third area in an opposite direction of the first direction.

11. The display device of claim 10, wherein one end of the second electrode faces the first branch area of the first electrode, and
    wherein the other end of the second electrode faces the second branch area of the first electrode.

12. The display device of claim 10, wherein the first light emitting element is between the first branch area of the first electrode and the second electrode, and
    wherein the second light emitting element is between the second branch area of the first electrode and the second electrode.

13. The display device of claim 9, further comprising third and fourth light emitting elements between the second area of the first electrode and the second electrode.

14. The display device of claim 13, wherein the second area has a third branch area extending from the other end of the third area in the opposite direction to the first direction and a fourth branch area extending from the other end of the third area in the first direction.

15. The display device of claim 14, wherein the third light emitting element is between the third branch area of the first electrode and the second electrode, and
    wherein the fourth light emitting element is between the fourth branch area of the first electrode and the second electrode.

16. The display device of claim 13, further comprising an insulation layer on the second end portions of the first to fourth light emitting elements,
    wherein the insulation layer does not overlap the first end portions of the first to fourth light emitting elements.

17. The display device of claim 16, wherein each of the first to fourth light emitting elements comprises a p-type semiconductor layer at the first end portion.

18. The display device of claim 16, further comprising a fifth contact electrode contacting the fourth contact electrode and the first end portion of the third light emitting element.

19. The display device of claim 18, wherein the fifth contact electrode contacts the fourth contact electrode through a contact opening penetrating through the insulation layer.

20. The display device of claim 18, wherein the fifth contact electrode is on the same layer as the first contact electrode and the third contact electrode.

* * * * *